US 11,476,282 B2

(12) United States Patent
Hara et al.

(10) Patent No.: US 11,476,282 B2
(45) Date of Patent: Oct. 18, 2022

(54) ACTIVE MATRIX SUBSTRATE AND METHOD FOR MANUFACTURING SAME

(71) Applicant: Sharp Kabushiki Kaisha, Sakai (JP)

(72) Inventors: Yoshihito Hara, Sakai (JP); Tohru Daitoh, Sakai (JP); Hajime Imai, Sakai (JP); Masaki Maeda, Sakai (JP); Tatsuya Kawasaki, Sakai (JP); Hideki Kitagawa, Sakai (JP); Yoshiharu Hirata, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 122 days.

(21) Appl. No.: 16/984,192

(22) Filed: Aug. 4, 2020

(65) Prior Publication Data

US 2021/0043656 A1 Feb. 11, 2021

Related U.S. Application Data

(60) Provisional application No. 62/884,784, filed on Aug. 9, 2019.

(51) Int. Cl.
*H01L 27/12* (2006.01)
*G02F 1/1343* (2006.01)
(Continued)

(52) U.S. Cl.
CPC .......... *H01L 27/124* (2013.01); *G02F 1/1368* (2013.01); *G02F 1/134363* (2013.01);
(Continued)

(58) Field of Classification Search
CPC ............... H01L 27/124; H01L 27/1225; H01L 27/1259; G02F 1/134363; G02F 1/136227;
(Continued)

(56) References Cited

U.S. PATENT DOCUMENTS 8,704,218 B2 * 4/2014 Yamazaki ........... H01L 29/7869
438/149
9,305,945 B2 * 4/2016 Shen ................... H01L 27/1214
(Continued)

FOREIGN PATENT DOCUMENTS

JP 2008-040343 A 2/2008
JP 2012-134475 A 7/2012
(Continued)

*Primary Examiner* — Ori Nadav
(74) *Attorney, Agent, or Firm* — Keating & Bennett, LLP

(57) ABSTRACT

An active matrix substrate includes gate bus lines; source bus lines; a lower insulating layer; an oxide semiconductor TFT; and a pixel electrode, in which the oxide semiconductor TFT includes an oxide semiconductor layer disposed on the lower insulating layer, a gate electrode, a source electrode, and a first ohmic conductive portion that is coupled to the oxide semiconductor layer and the source electrode, the lower insulating layer includes a source opening portion exposing at least a portion of the source electrode, the first ohmic conductive portion is disposed on the lower insulating layer and in the source opening portion and is in direct contact with at least the portion of the source electrode in the source opening portion, and the first region of the oxide semiconductor layer is in direct contact with an upper surface of the first ohmic conductive portion.

18 Claims, 17 Drawing Sheets

(51) Int. Cl.
*G02F 1/1368* (2006.01)
*G02F 1/1362* (2006.01)

(52) U.S. Cl.
CPC .. *G02F 1/136227* (2013.01); *G02F 1/136286* (2013.01); *H01L 27/1225* (2013.01); *H01L 27/1259* (2013.01); *G02F 1/13685* (2021.01); *G02F 1/136295* (2021.01)

(58) Field of Classification Search
CPC ............ G02F 1/136286; G02F 1/1368; G02F 1/136295; G02F 1/13685
USPC .......................................................... 257/43
See application file for complete search history.

(56) References Cited

U.S. PATENT DOCUMENTS

| | | | | |
|---|---|---|---|---|
| 9,685,466 | B2* | 6/2017 | Kim | H01L 29/7869 |
| 10,326,008 | B2* | 6/2019 | Kimura | H01L 29/78633 |
| 2008/0035920 | A1 | 2/2008 | Takechi et al. | |
| 2010/0296019 | A1* | 11/2010 | Taniguchi | G02F 1/134336 349/44 |
| 2012/0138922 | A1 | 6/2012 | Yamazaki et al. | |
| 2013/0153904 | A1* | 6/2013 | Nishimura | H01L 27/1255 438/155 |
| 2013/0320334 | A1 | 12/2013 | Yamazaki et al. | |
| 2014/0225108 | A1* | 8/2014 | Yamazaki | H01L 29/78696 257/43 |
| 2014/0286076 | A1 | 9/2014 | Aoki et al. | |
| 2015/0115323 | A1* | 4/2015 | Kawai | H01L 29/36 438/270 |
| 2017/0090229 | A1 | 3/2017 | Imai et al. | |
| 2019/0157307 | A1* | 5/2019 | Yamazaki | H01L 29/7869 |
| 2021/0183899 | A1* | 6/2021 | Imai | H01L 27/127 |
| 2021/0249445 | A1* | 8/2021 | Suzuki | H01L 27/1237 |

FOREIGN PATENT DOCUMENTS

| | | |
|---|---|---|
| JP | 2014-007399 A | 1/2014 |
| JP | 2014-209727 A | 11/2014 |
| JP | 2015-109315 A | 6/2015 |
| WO | 2015/186619 A1 | 12/2015 |

* cited by examiner

ACTIVE MATRIX SUBSTRATE AND METHOD FOR MANUFACTURING SAME

CROSS-REFERENCE TO RELATED APPLICATION

The present application claims priority from Provisional Application No. 62/884,784, the content to which is hereby incorporated by reference into this application.

BACKGROUND OF THE INVENTION

1. Field of the Invention

The present invention relates to an active matrix substrate and a method for manufacturing the same.

2. Description of the Related Art

A display device including an active matrix substrate provided with a switching element for each pixel is widely used. An active matrix substrate including a thin film transistor (hereinafter, referred to as "TFT") as a switching element is referred to as a TFT substrate. In the present specification, a portion of the TFT substrate corresponding to a pixel of the display device is referred to as a pixel region or a pixel. The TFT provided as the switching element in each pixel of the active matrix substrate is referred to as a "pixel TFT". A plurality of source bus lines and a plurality of gate bus lines are provided on the TFT substrate, and pixel TFTs are disposed near intersection portions of these. A source electrode of the pixel TFT is coupled to one of the source bus lines, and a gate electrode is coupled to one of the gate bus lines.

In recent years, it has been proposed to use an oxide semiconductor instead of amorphous silicon or polycrystalline silicon as a material for an active layer of the TFT. Such a TFT is referred to as an "oxide semiconductor TFT". The oxide semiconductor has higher mobility than amorphous silicon. Therefore, the oxide semiconductor TFT can operate at higher speed than an amorphous silicon TFT. Since an oxide semiconductor film is formed by a simpler process than a polycrystalline silicon film, the oxide semiconductor film can be applied to an apparatus which requires a large area.

Most of oxide semiconductor TFTs are bottom gate type TFTs, but top gate type oxide semiconductor TFTs have also been proposed (for example, PTL 1 (Japanese Unexamined Patent Application Publication No. 2015-109315) and PTL 2 (International Publication No. 2015/186619)).

PTL 1 discloses a top gate type TFT in which a gate electrode is provided on a portion of an oxide semiconductor layer with a gate insulating layer interposed therebetween, and source and drain electrodes are provided on an insulating layer which covers the gate electrode.

On the other hand, PTL 2 by the present applicant proposes a substrate structure (hereinafter, "lower source structure") in which a source electrode and a source bus line are provided closer to a substrate side than a gate bus line. In this structure, the source bus line is disposed closer to the substrate than the oxide semiconductor layer of the oxide semiconductor TFT, and the gate bus line is disposed above the oxide semiconductor layer. According to the TFT substrate having the lower source structure (hereinafter, referred to as "lower source structure substrate"), since an insulating layer located between the source bus line and the gate bus line can be thickened, it is possible to reduce the parasitic capacitance generated at an intersection portion of these bus lines.

SUMMARY OF THE INVENTION

In the lower source structure substrate, an active layer of the pixel TFT is disposed on an insulating layer (lower insulating layer) covering a corresponding source bus line, and is coupled to an upper surface of the source bus line (or source electrode formed integrally with the source bus line) in an opening portion formed in the lower insulating layer. In the present specification, a coupling portion that electrically couples the active layer of the pixel TFT and the source bus line is referred to as a "source contact portion".

As a result of a study by the present inventors, it may be difficult to reduce the contact resistance of the source contact portion when an oxide semiconductor TFT is used as the pixel TFT in the lower source structure substrate. For example, depending on a material of the source bus line, it is difficult to form a good ohmic contact with the oxide semiconductor layer (for example, In—Ga—Zn—O based semiconductor layer) which is the active layer of the pixel TFT. Also when a material capable of forming an ohmic contact with the oxide semiconductor layer is used as a material of the source bus line, the surface of the source bus line (or source electrode) may be damaged or contaminated by the process. Therefore, the contact resistance with the oxide semiconductor layer may increase. Details will be described later.

According to an embodiment of the present invention, there is provided an active matrix substrate that includes an oxide semiconductor TFT in each pixel region and can reduce the contact resistance of a coupling portion for electrically coupling an oxide semiconductor layer of the oxide semiconductor TFT and a source bus line.

Solution to Problem

The present specification discloses an active matrix substrate and a method for manufacturing the active matrix substrate described in the following items.

[Item 1]

An active matrix substrate that includes a display region having a plurality of pixel regions, and a non-display region other than the display region, the active matrix substrate includes a substrate; a plurality of gate bus lines that is supported on a main surface of the substrate and extends in a first direction, and a plurality of source bus lines that extends in a second direction intersecting the first direction, and is located closer to the substrate than the plurality of gate bus lines; a lower insulating layer that is located between the plurality of source bus lines and the plurality of gate bus lines, and covers the plurality of source bus lines; and an oxide semiconductor TFT and a pixel electrode which are disposed in corresponding one of the plurality of pixel regions, in which the oxide semiconductor TFT includes an oxide semiconductor layer disposed on the lower insulating layer, a gate electrode that is disposed on a portion of the oxide semiconductor layer with a gate insulating layer therebetween, and is electrically coupled to a corresponding one of the plurality of gate bus lines, a source electrode that is formed using the same conductive film as that of the plurality of source bus lines between the lower insulating layer and the substrate, and is electrically coupled to a corresponding one of the plurality of source bus lines, and a first ohmic conductive portion that is formed of a conductive material capable of forming an ohmic contact with the oxide semiconductor layer between the oxide semiconductor layer, and the lower insulating layer and the source electrode, and is coupled to the oxide semiconductor layer and the source electrode, the oxide semiconductor layer includes a channel region, and a first region and a second region which are located on respective sides of the channel region, the first region is electrically coupled to the source electrode, and the second region is electrically coupled to the pixel electrode, the lower insulating layer includes a source opening portion exposing at least a portion of the source electrode, and the first ohmic conductive portion is disposed on the lower insulating layer and in the source opening portion and is in direct contact with at least the portion of the source electrode in the source opening portion, and the first region of the oxide semiconductor layer is in direct contact with an upper surface of the first ohmic conductive portion.

[Item 2]

In the active matrix substrate according to Item 1, the oxide semiconductor TFT further includes a second ohmic conductive portion that is disposed between the lower insulating layer and the second region of the oxide semiconductor layer, is formed of the same conductive film as that of the first ohmic conductive portion, and is electrically insulated from the first ohmic conductive portion, and a drain electrode that couples the second region of the oxide semiconductor layer and the pixel electrode, the second region of the oxide semiconductor layer is in direct contact with an upper surface of the second ohmic conductive portion, and the drain electrode and the second ohmic conductive portion at least partially overlap each other with the oxide semiconductor layer therebetween.

[Item 3]

The active matrix substrate according to Item 2, further including an interlayer insulating layer that covers the oxide semiconductor layer and the gate electrode, in which the drain electrode is disposed on the interlayer insulating layer and in a drain opening portion formed in the interlayer insulating layer, and is in contact with an upper surface of the second region of the oxide semiconductor layer in the drain opening portion.

[Item 4]

In the active matrix substrate according to Item 1, the oxide semiconductor TFT further includes a second ohmic conductive portion that is disposed between the lower insulating layer and the oxide semiconductor layer, is formed of the same conductive film as that of the first ohmic conductive portion, and is electrically insulated from the first ohmic conductive portion, the second region of the oxide semiconductor layer is in direct contact with an upper surface of the second ohmic conductive portion, and the pixel electrode is in direct contact with the second region of the oxide semiconductor layer.

[Item 5]

In the active matrix substrate according to Item 4, the second region of the oxide semiconductor layer includes an opening portion exposing a portion of the upper surface of the second ohmic conductive portion, and the pixel electrode is in direct contact with a side surface of the opening portion and the portion of the upper surface of the second ohmic conductive portion in the opening portion of the oxide semiconductor layer.

[Item 6]

In the active matrix substrate according to Item 1, the first ohmic conductive portion is formed of a conductive film which is transparent, the pixel electrode is disposed between the lower insulating layer and the oxide semiconductor layer, and is formed of the same conductive film as that of the first ohmic conductive portion, and the second region of the oxide semiconductor layer is in direct contact with an upper surface of the pixel electrode.

[Item 7]

In the active matrix substrate according to any one of Items 1 to 6, the oxide semiconductor layer covers an entirety of the upper surface and an entirety of a side surface of the first ohmic conductive portion.

[Item 8]

In the active matrix substrate according to any one of Items 1 to 7, neither the first ohmic conductive portion nor any conductive portion formed of the same conductive film as that of the first ohmic conductive portion is disposed at an intersection portion in which the corresponding one of the source bus lines and the corresponding one of the gate bus lines intersect each other, when viewed from a direction normal to the substrate.

[Item 9]

The active matrix substrate according to any one of Items 1 to 7, further including an ohmic wiring unit that is formed of the same conductive film as that of the first ohmic conductive portion, and extends in the first direction along the corresponding one of the source bus lines, in which the ohmic wiring unit extends so as to couple first ohmic conductive portions of two adjacent oxide semiconductor TFTs coupled to the corresponding one of the source bus lines.

[Item 10]

In the active matrix substrate according to Item 9, the ohmic wiring unit is disposed on the corresponding one of the source bus lines with the lower insulating layer therebetween.

[Item 11]

The active matrix substrate according to Item 9 or 10, further including a wiring protection portion that is formed of the same semiconductor film as that of the oxide semiconductor layer, and extends in the first direction so as to cover the ohmic wiring unit.

[Item 12]

The active matrix substrate according to any one of Items 1 to 11, further including at least one another oxide semiconductor TFT disposed in the non-display region, in which the at least one other oxide semiconductor TFT includes another oxide semiconductor layer, a source electrode wire coupled to a portion of the other oxide semiconductor layer, a drain electrode wire coupled to another portion of the other oxide semiconductor layer, and a gate electrode wire disposed on the other oxide semiconductor layer with an insulating layer therebetween, one of the source electrode wire and the drain electrode wire is formed between the lower insulating layer and the substrate using the same conductive film as that of the plurality of source bus lines, and the other of the source electrode wire and the drain electrode wire is formed on the lower insulating layer using the same conductive film as that of the first ohmic conductive portion.

[Item 13]

In the active matrix substrate according to any one of Items 1 to 5 and 7 to 12, the first ohmic conductive portion mainly contains at least one metal selected from the group consisting of Ti, Mo, Ta, and W.

[Item 14]

In the active matrix substrate according to Item 13, the first ohmic conductive portion is formed of a Ti film or a Mo film.

[Item 15]

In the active matrix substrate according to any one of Items 1 to 12, the first ohmic conductive portion mainly contains at least one metal oxide selected from the group consisting of indium tin oxide, indium zinc oxide, zinc oxide, and tin oxide.

[Item 16]

In the active matrix substrate according to any one of Items 1 to 15, the plurality of source bus lines include a low resistance metal layer containing Cu or Al, and the first ohmic conductive portion is in direct contact with the low resistance metal layer.

[Item 17]

In the active matrix substrate according to any one of Items 1 to 16, the oxide semiconductor layer includes an In—Ga—Zn—O-based semiconductor.

[Item 18]

In the active matrix substrate according to Item 17, the In—Ga—Zn—O-based semiconductor includes a crystalline portion.

[Item 19]

A method for manufacturing an active matrix substrate that includes a display region having a plurality of pixel regions and a non-display region other than the display region, and having an oxide semiconductor TFT in corresponding one of the plurality of pixel regions, the method including a step (a) of forming a lower metal layer by forming a lower conductive film on a substrate and patterning the lower conductive film, in which the lower metal layer includes a plurality of source bus lines and a source electrode disposed in a TFT forming region forming the oxide semiconductor TFT; a step (b) of forming a lower insulating layer on the lower metal layer, and forming a source opening portion that exposes a portion of the source electrode of the oxide semiconductor TFT in the lower insulating layer; a step (c) of forming an ohmic layer by forming an ohmic conductive film containing a conductive material capable of forming an ohmic contact with an oxide semiconductor layer of the oxide semiconductor TFT on the lower insulating layer and in the source opening portion and patterning the ohmic conductive film, in which the ohmic layer includes a first ohmic conductive portion in direct contact with the portion of the source electrode in the source opening portion; a step (d) of forming the oxide semiconductor layer of the oxide semiconductor TFT so as to be in contact with an upper surface of the first ohmic conductive portion on the lower insulating layer and the ohmic layer in the TFT forming region; a step (e) of forming a gate insulating layer and a gate electrode on a portion of the oxide semiconductor layer in the TFT forming region, in which in the oxide semiconductor layer, a region overlapping the gate electrode when viewed from a direction normal to the substrate is a channel region, a region in contact with the first ohmic conductive portion is a first region, and a region located on a side of the channel region opposite to a side where the first region is located is a second region; and a step (f) of forming a drain electrode or a pixel electrode so as to be in contact with an upper surface of the second region of the oxide semiconductor layer in the oxide semiconductor TFT.

[Item 20]

In the method for manufacturing an active matrix substrate according to Item 19, in the step (c), in the TFT forming region, the ohmic layer further includes a second ohmic conductive portion disposed and insulated from the first ohmic conductive portion, and in the step (d), the oxide semiconductor layer of the oxide semiconductor TFT is disposed such that a portion of the oxide semiconductor layer to be the second region is in contact with an upper surface of the second ohmic conductive portion.

[Item 21]

In the method for manufacturing an active matrix substrate according to Item 20, in the TFT forming region, the second ohmic conductive portion at least partially overlaps the drain electrode or the pixel electrode with the oxide semiconductor layer therebetween.

[Item 22]

In the method for manufacturing an active matrix substrate according to any one of Items 19 to 21, a heat treatment on the lower insulating layer is performed at a temperature of 200° C. or higher after forming the lower insulating layer and before forming the ohmic conductive film.

[Item 23]

In the method for manufacturing an active matrix substrate according to any one of Items 19 to 22, the first ohmic conductive portion mainly contains at least one metal selected from the group consisting of Ti, Mo, Ta, and W.

[Item 24]

In the method for manufacturing an active matrix substrate according to any one of Items 19 to 22, the first ohmic conductive portion mainly contains at least one metal oxide selected from the group consisting of indium tin oxide, indium zinc oxide, zinc oxide, and tin oxide.

[Item 25]

In the method for manufacturing an active matrix substrate according to any one of Items 19 to 24, the oxide semiconductor layer includes an In—Ga—Zn—O-based semiconductor.

[Item 26]

In the method for manufacturing an active matrix substrate according to Item 25, the In—Ga—Zn—O-based semiconductor includes a crystalline portion.

According to an embodiment of the present invention, there is provided the active matrix substrate that includes the oxide semiconductor TFT in each pixel region and can reduce the contact resistance of the coupling portion for electrically coupling the oxide semiconductor layer of the oxide semiconductor TFT and the source bus line.

DETAILED DESCRIPTION OF THE INVENTION

In a lower source structure substrate using an oxide semiconductor TFT as a pixel TFT, an oxide semiconductor layer of the oxide semiconductor TFT is coupled to an upper surface of a source bus line (or source electrode formed using the same conductive film as the source bus line) (source contact portion). When the source bus line is formed of a low resistance metal film such as a Cu film or an Al film in order to reduce the wiring resistance of the source bus line, since it is difficult to form an ohmic contact between the low resistance metal film and the oxide semiconductor layer, it is difficult to suppress the contact resistance in the source contact portion to be small. For example, when the Cu film or Al film is disposed so as to be in direct contact with the oxide semiconductor layer, the contact resistance per unit area of 5 μm×5 μm on a contact surface is larger than 500Ω. When the Cu film and the Al film are subject to process damage and electrolytic corrosion reaction (in the case of Al), the contact resistance further increases.

On the other hand, in PTL 2 by the applicant, or the like, a source bus line is formed using a laminated film having a Ti film as an upper layer (for example, a laminated film in which a Ti film, a Cu film, and a Ti film are laminated from a substrate side). Since the Ti film can form an ohmic contact with the oxide semiconductor layer, the contact resistance with the oxide semiconductor layer may be reduced as compared with the case where the source bus line is formed only of the Cu film.

In the present specification, a film which can form the ohmic contact with the oxide semiconductor is referred to as an "ohmic conductive film". When the ohmic conductive film and the oxide semiconductor layer are disposed to be in direct contact with each other, the contact resistance on the contact surface can be suppressed to less than 500Ω per unit area of 5 μm×5 μm.

However, as a result of the study by the present inventor, it is found that, in the lower source structure substrate, when the source bus line is formed by using the laminated film having the ohmic conductive film as the upper layer, and the upper surface of the source bus line (for example, Ti surface) is damaged or contaminated by the process, a good contact with the oxide semiconductor layer may not be obtained and the contact resistance may not be sufficiently reduced. Hereinafter, description will be given with reference to the drawings.

Figure 11A:
FIG. 11A is a step sectional view illustrating a process of forming a source contact portion in a reference example.
Figure 11B:
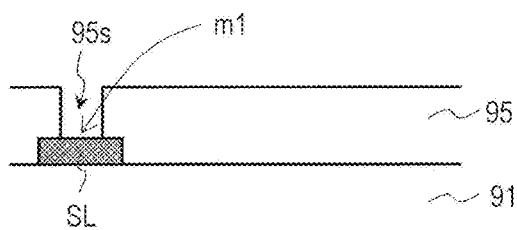
FIG. 11B is a step sectional view illustrating the process of forming the source contact portion in the reference example.
Figure 11C:
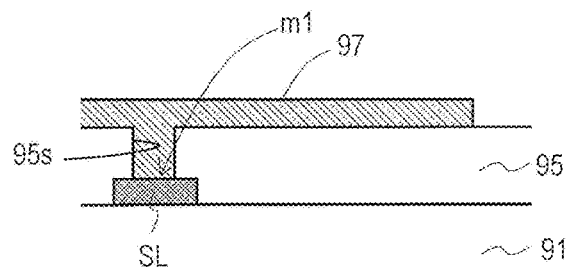
FIG. 11C is a step sectional view illustrating the process of forming the source contact portion in the reference example.

FIGS. 11A to 11C are step sectional views illustrating a reference example of a process for forming a source contact portion in a lower source structure substrate.

First, as illustrated in FIG. 11A, a source conductive film is formed on a substrate 91, and the source conductive film is patterned to form a lower metal layer including the source bus line SL.

Subsequently, as illustrated in FIG. 11B, a lower insulating layer 95 covering the lower metal layer is formed. Thereafter, in order to secure the reliability of the lower insulating layer 95, the lower insulating layer 95 may be annealed. The annealing treatment is performed in the atmosphere at a temperature of 200 to 450° C., for example. Next, the lower insulating layer 95 is etched to form a source opening portion 95s exposing a portion of a surface m1 of the source bus line SL.

Subsequently, as illustrated in FIG. 11C, an oxide semiconductor film (for example, an In—Ga—Zn—O-based semiconductor film) is formed on the lower insulating layer 95 and in the source opening portion 95s, and the oxide semiconductor film is patterned, and therefore an oxide semiconductor layer 97 is obtained. The oxide semiconductor layer 97 is in direct contact with the exposed surface m1 of the source bus line SL in the source opening portion 95s.

In the above process, the surface m1 of the source bus line SL exposed in the source opening portion 95s may be damaged or contaminated by the etching of the lower insulating layer 95. When an oxide film ($SiO_2$ film or the like) is formed as the lower insulating layer 95, the surface of the source bus line SL may be oxidized by coming into contact with the lower insulating layer 95. Although the annealing treatment may be performed after forming the source opening portion 95s in the lower insulating layer 95, in that case, the surface of the source bus line SL may be oxidized or damaged by the annealing treatment. As a result, a good ohmic contact may not be formed between the surface m1 of the source bus line SL and the oxide semiconductor layer 97 in the source opening portion 95s, and the contact resistance may increase. For example, when the source bus line SL is formed of a laminated film having Ti as an upper layer, and the exposed surface (Ti surface) m1 of the source bus line SL is oxidized by the annealing treatment, the contact resistance may increase.

As a result of a study based on the above findings, the present inventor has found that the above problem may be suppressed by forming the ohmic conductive film so as to cover the exposed surface m1 of the source bus line SL, after forming the source opening portion 95s in the lower insulating layer 95 and before forming the oxide semiconductor film. The ohmic conductive film can stably contact the exposed surface m1 of the source bus line SL subjected to the process damage. Furthermore, since the ohmic conductive film is formed after annealing the lower insulating layer 95, the ohmic conductive film is not damaged by the annealing treatment or the etching step. Therefore, it is possible to stably form an ohmic contact with the oxide semiconductor layer 97.

Embodiment

Hereinafter, the active matrix substrate according to a first embodiment will be described with reference to the drawings.

Figure 1:
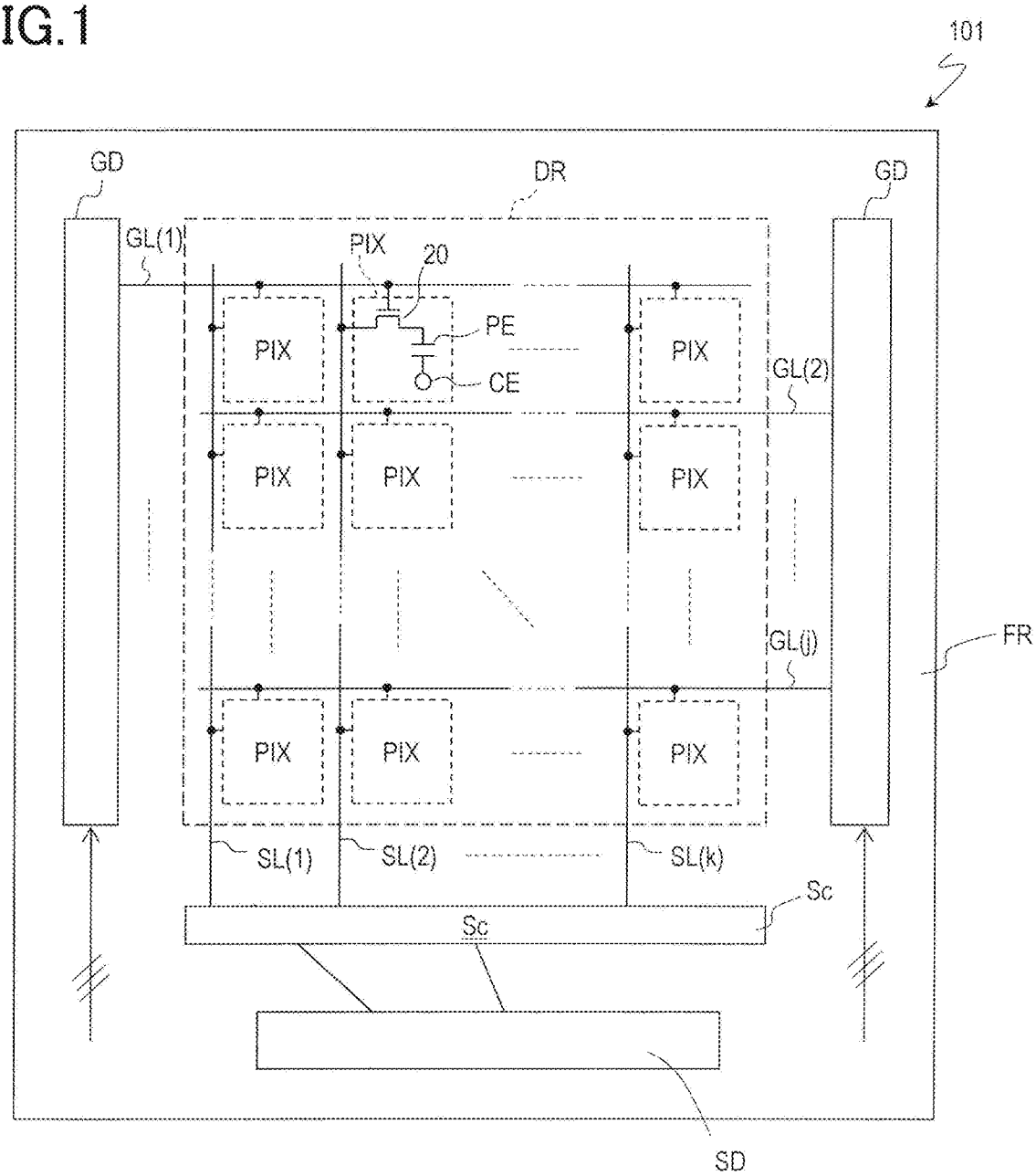
FIG. 1 is a schematic diagram illustrating an example of a planar structure of an active matrix substrate 101.

FIG. 1 is a diagram schematically illustrating an example of a planar structure of the active matrix substrate 101. The active matrix substrate 101 includes a plurality of pixel regions PIX, a display region DR contributing to display, and a peripheral region (frame region) FR located outside the display region DR. The pixel region PIX (may be referred to as "pixel") is a region corresponding to a pixel of the display device.

In the display region DR, the active matrix substrate 101 is provided with a substrate 1, a plurality of TFTs (pixel TFTs) 20 supported by the substrate 1, a plurality of pixel electrodes PE, a plurality of gate bus lines GL(1) to GL(j) for supplying a gate signal to the TFT 20 (j is an integer of 2 or more, and hereinafter, collectively referred to as "gate bus line GL"), and a plurality of source bus lines SL(1) to SL(k) for supplying a source signal to the pixel TFT 20 (k is an integer of 2 or more, and hereinafter, collectively referred to as "source bus line SL").

The source bus line SL extends in a direction intersecting with the gate bus line GL. In the present specification, a direction y where the source bus line SL extends is referred to as a "first direction", and a direction x where the gate bus line GL extends is referred to as a "second direction". The first direction y and the second direction x may be orthogonal to each other. Each pixel region PIX is defined by, for example, the gate bus line GL and the source bus line SL. A plurality of pixel regions PIX are arranged in a matrix, for example.

Each TFT 20 and each pixel electrode PE are provided corresponding to one of the plurality of pixel regions PIX. The gate electrode GE of each TFT 20 is electrically coupled to a corresponding gate bus line GL. A portion (first region) of the oxide semiconductor layer of each TFT 20 is electrically coupled to the corresponding source bus line SL, and the other portion (second region) is electrically coupled to the corresponding pixel electrode PE.

In the non-display region FR, a peripheral circuit such as a driver can be provided. In this example, a gate driver GD driving the gate bus line GL and an SSD circuit Sc driving the source bus line SL in a time division manner are integrally (monolithically) provided. A driver IC including the source driver SD may be mounted in the non-display region FR of the active matrix substrate 101.

In a case where the active matrix substrate 101 is applied to a display device of a horizontal electric field mode such as a fringe field switching (FFS) mode, the active matrix substrate 101 is provided with a common electrode CE for a plurality of pixels PIX.

<Pixel Region>

Hereinafter, a structure of the pixel region of the active matrix substrate according to the present embodiment will be described using an active matrix substrate applied to an FFS mode display device as an example with reference to the drawings. The FFS mode is a lateral electric field mode in which a pair of electrodes is provided on one substrate and an electric field is applied to liquid crystal molecules in a direction (lateral direction) parallel to a substrate surface.

In the following description, a layer including an electrode and wiring formed using the same conductive film (source conductive film) as the source bus line SL is referred to as a "lower metal layer LM". A layer including an electrode and wiring formed using the same conductive film (gate conductive film) as the gate bus line GL is referred to as a "gate metal layer GM". A layer including an electrode and wiring formed using the same conductive film (drain conductive film) as the drain electrode of the oxide semiconductor TFT is referred to as a "drain metal layer DM". In the present embodiment, the lower metal layer LM is located closer to the substrate than the gate metal layer GM (lower source structure). As described later, the active matrix substrate according to the present embodiment further includes a layer formed using a conductive film (ohmic conductive film) capable of forming an ohmic contact with the oxide semiconductor between the lower metal layer LM and the oxide semiconductor layer of the oxide semiconductor TFT. This layer is referred to as "ohmic layer OM".

In the drawings, the layers in which the electrodes and wires are formed may be illustrated in parentheses after the reference numerals of the respective constituent elements. For example, the electrode or wiring formed in the gate metal layer GM may be denoted by "(GM)" after the reference number.

Figure 2A:
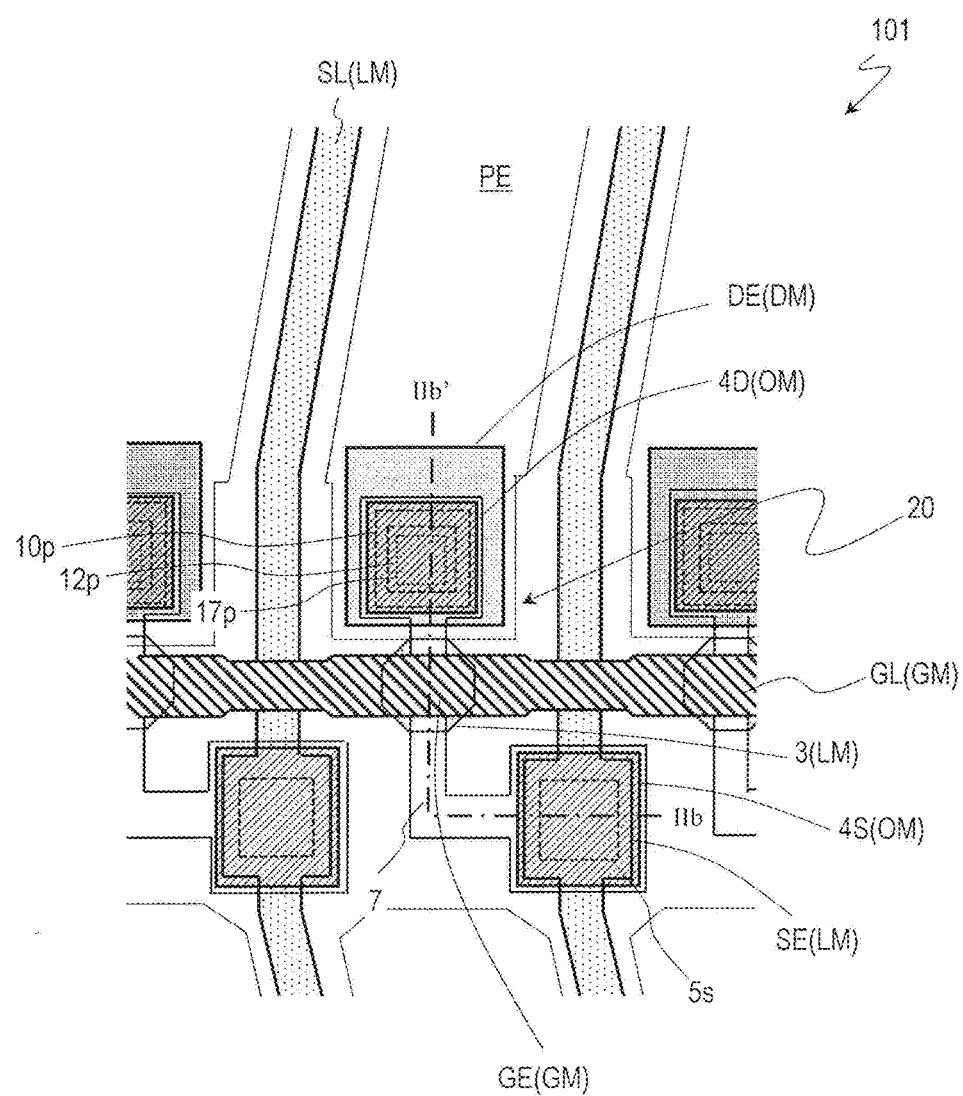
FIG. 2A is a plan view illustrating a pixel region in the active matrix substrate 101 according to a first embodiment.
Figure 2B:
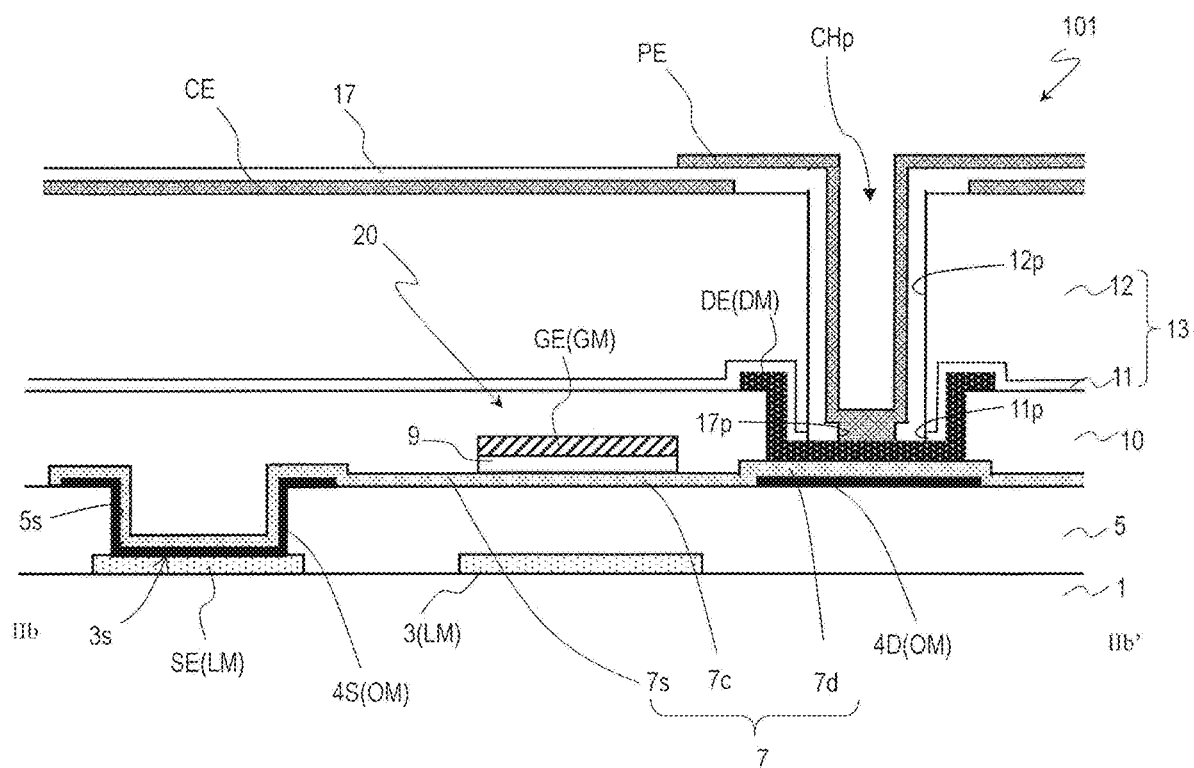
FIG. 2B is a sectional view of the active matrix substrate 101 taken along line IIb-IIb' illustrated in FIG. 2A.

FIG. 2A is a plan view illustrating a pixel region in the active matrix substrate 101, and FIG. 2B is a sectional view taken along line IIb-IIb' across the TFT 20 in the pixel region.

The active matrix substrate 101 includes a substrate 1 and a plurality of source bus lines SL and a plurality of gate bus lines GL supported on a main surface of the substrate 1. Each pixel region is defined by one source bus line SL and one gate bus line GL. Each pixel region has a top gate type TFT 20, a pixel electrode PE, and a common electrode CE.

In the present embodiment, the source bus line SL is located closer to the substrate 1 side than the gate bus line GL (lower source structure). That is, the lower metal layer LM is located closer to the substrate 1 side than the gate metal layer GM. The lower insulating layer 5, the ohmic layer OM formed of the ohmic conductive film, the oxide semiconductor layer 7, the gate insulating layer 9, and the gate metal layer GM are disposed in this order on the lower metal layer LM.

The TFT 20 is provided with the oxide semiconductor layer 7 disposed on the lower insulating layer 5, a gate electrode GE disposed on a portion of the oxide semiconductor layer 7 with the gate insulating layer 9 therebetween, a source electrode SE disposed between the lower insulating layer 5 and the substrate 1, a first ohmic conductive portion 4S disposed between the oxide semiconductor layer 7, the source electrode SE and the lower insulating layer 5, and a drain electrode DE. In the TFT 20, the oxide semiconductor layer 7 and the source electrode SE are electrically coupled to each other with the first ohmic conductive portion 4S (source contact portion) therebetween.

The source electrode SE is formed in the lower metal layer LM and is electrically coupled to the corresponding source bus line SL. The gate electrode GE is formed in the gate metal layer GM and is electrically coupled to the corresponding gate bus line GL. The first ohmic conductive portion 4S is formed (in the ohmic layer OM) using the ohmic conductive film.

The oxide semiconductor layer 7 includes a channel region 7c, and a first region 7s and a second region 7d disposed on both sides thereof, respectively. The first region 7s and the second region 7d are low resistance regions having a lower resistivity than the channel region 7c. The gate electrode GE is disposed so as to overlap the channel region 7c when viewed from the direction normal to the main surface of the substrate 1 (hereinafter, abbreviated as "direction normal to the substrate 1"). The gate insulating layer 9 may cover the channel region 7c and may not cover the first region 7s and the second region 7d. The first region 7s is electrically coupled to the corresponding source bus line SL, and the second region 7d is electrically coupled to the corresponding pixel electrode PE.

The source electrode SE may be coupled to (integrally formed with) the source bus line SL. The source electrode SE may be a portion of the source bus line SL. In such a case, a portion of the source bus line SL coupled to the first region 7s may be referred to as a "source electrode SE". The gate electrode GE may be coupled to (integrally formed with) the gate bus line GL. The gate electrode GE may be a portion of the gate bus line GL. In this case, a portion of the gate bus line GL that overlaps the oxide semiconductor layer 7 when viewed from the direction normal to the substrate 1 may be referred to as a "gate electrode GE".

The lower metal layer LM including the source electrode SE and the source bus line SL is covered with the lower insulating layer 5. In the source contact portion, a source opening portion 5s exposing a portion 3s of the upper surface of the source electrode SE (here, a portion of the source bus line SL) is formed in the lower insulating layer 5.

The first ohmic conductive portion 4S is disposed on the lower insulating layer 5 and in the source opening portion 5s, and is in direct contact with the exposed surface 3s of the source electrode SE in the source opening portion 5s. The first ohmic conductive portion 4S of the TFT 20 has, for example, an island shape, and may be disposed separately (at intervals) from the first ohmic conductive portion of the TFT in the adjacent pixel region.

The first ohmic conductive portion 4S may cover the entire exposed surface 3s of the source electrode SE. In this example, the first ohmic conductive portion 4S is disposed so as to cover the entire exposed surface 3s of the source electrode SE, the entire side surface of the source opening portion 5s, and a portion of the upper surface of the lower insulating layer 5 located near a peripheral edge of the source opening portion 5s.

The ohmic layer OM may further include a second ohmic conductive portion 4D electrically insulated from the first ohmic conductive portion 4S. The second ohmic conductive portion 4D is disposed between the lower insulating layer 5 and the oxide semiconductor layer 7, and has, for example, an island shape. When viewed from the direction normal to the substrate 1, the second ohmic conductive portion 4D is disposed on a side opposite to the first ohmic conductive portion 4S with the gate electrode GE interposed therebetween. In the region where the second ohmic conductive portion 4D is disposed, an opening portion is not provided in the lower insulating layer 5, and the entire second ohmic conductive portion 4D is located on the lower insulating layer 5. The ohmic layer OM may include the first ohmic conductive portion 4S, and may not include the second ohmic conductive portion 4D.

The ohmic layer OM is formed using a conductive film (ohmic conductive film) capable of forming an ohmic contact with the oxide semiconductor. The ohmic conductive film may be a metal film such as a Ti film or a metal oxide film such as an indium tin oxide film. For example, the ohmic conductive film may be a metal film mainly containing at least one metal selected from the group consisting of Ti, Mo, Ta, and W. Alternatively, the ohmic conductive film may be a metal oxide film mainly containing at least one metal oxide selected from the group consisting of an indium tin oxide (ITO) film, an indium zinc oxide (In—Zn—O) film, a zinc oxide (ZnO) film, and a tin oxide ($SnO_2$) film.

The oxide semiconductor layer 7 is disposed on the lower insulating layer 5 and the ohmic layer OM. The first region 7s of the oxide semiconductor layer 7 is in direct contact with the upper surface of the first ohmic conductive portion 4S, and is electrically coupled to the corresponding source bus line SL with the first ohmic conductive portion 4S therebetween. In this example, the first region 7s of the oxide semiconductor layer 7 is disposed so as to be in direct contact with the upper surface of the first ohmic conductive portion 4S, and the second region 7d is disposed so as to be in direct contact with the upper surface of the second ohmic conductive portion 4D.

The oxide semiconductor layer 7 may cover the entire surface (entire upper surface and entire side surface) of the first ohmic conductive portion 4S. That is, when viewed from the direction normal to the substrate 1, the entire first ohmic conductive portion 4S may be located inside the peripheral edge of the oxide semiconductor layer 7. Similarly, the oxide semiconductor layer 7 may cover the entire second ohmic conductive portion 4D.

The gate insulating layer 9 may be disposed on at least the channel region 7c of the oxide semiconductor layer 7. In this example, the gate insulating layer 9 is disposed only between the gate electrode GE and the oxide semiconductor layer 7. The side surface of the gate insulating layer 9 and the side surface of the gate electrode GE may be coincided with each other. Such a structure can be obtained by etching the gate insulating layer 9 and the gate conductive film using the same mask.

The TFT 20 may have a light shielding layer 3 on the substrate 1 side of the oxide semiconductor layer 7. The light shielding layer 3 can be formed by using, for example, a source conductive film (that is, in the lower metal layer LM). The light shielding layer 3 may be disposed so as to overlap at least the channel region 7c of the oxide semiconductor layer 7 when viewed from the direction normal to the substrate 1. As a result, deterioration of characteristics of the oxide semiconductor layer 7 due to light (backlight light) from the substrate 1 side can be suppressed.

The oxide semiconductor layer 7, the gate insulating layer 9, and the gate metal layer GM are covered with the interlayer insulating layer 10. A drain metal layer DM including the drain electrode DE of the TFT 20 is formed on the interlayer insulating layer 10.

The drain electrode DE is disposed on the interlayer insulating layer 10 and in the drain opening portion 10p provided in the interlayer insulating layer 10, and is coupled to the second region 7d of the oxide semiconductor layer 7 in the drain opening portion 10p. The drain electrode DE may be in direct contact with the upper surface of the second region 7d.

When the second ohmic conductive portion 4D is formed in the ohmic layer OM, a portion (referred to as a "first portion") of the second region 7d of the oxide semiconductor layer 7, which is in direct contact with the second ohmic conductive portion 4D as a conductive layer, has a lower resistance than that of the other portion. When the drain electrode DE is disposed so as to be in contact with the first portion of the oxide semiconductor layer 7 (that is, the drain electrode DE and the second ohmic conductive portion 4D are disposed so as to at least partially overlap each other with the oxide semiconductor layer 7 therebetween), the contact resistance between the drain electrode DE and the oxide semiconductor layer 7 may be further reduced.

An upper insulating layer 13 is formed on the drain metal layer DM so as to cover the TFT 20. The upper insulating layer 13 includes, for example, an inorganic insulating layer (passivation film) 11. As illustrated in the drawing, the upper insulating layer 13 may have a laminated structure including the inorganic insulating layer 11 and an organic insulating layer 12 formed on the inorganic insulating layer 11. The organic insulating layer 12 may not be formed. Alternatively, the organic insulating layer 12 may be formed inly in the display region.

On the upper insulating layer 13, a common electrode CE is formed. The common electrode CE may not be insulated for each pixel region PIX. For example, the common electrode CE may have an opening portion in a region (pixel contact region) where the pixel contact hole CHp is formed, and may be formed over the entire pixel region PIX except for the pixel contact region.

The pixel electrode PE is disposed on the common electrode CE with the dielectric layer 17 therebetween. The pixel electrode PE is insulated for each pixel region PIX. In each pixel region PIX, the pixel electrode PE is provided with one or a plurality of slits (opening portions) or cutout portions.

The pixel electrode PE is disposed on the dielectric layer 17 and is coupled to the second region 7d of the oxide semiconductor layer 7 in the pixel contact hole CHp formed in the upper insulating layer 13 and the dielectric layer 17. In this example, the pixel contact hole CHp is configured to include an opening portion 11p of the inorganic insulating layer 11, an opening portion 12p of the organic insulating layer 12, and an opening portion 17p of the dielectric layer 17.

As described above with reference to FIGS. 11A to 11C, in the source contact portion of the reference example, the surface of the source bus line SL might be damaged by a process of forming the lower insulating layer 95 (etching, annealing treatment). For example, there is a possibility that the surface of the source bus line SL is oxidized by the annealing treatment, the electric resistance is increased, and the adhesion with the oxide semiconductor layer is reduced.

On the other hand, in the present embodiment, after etching and annealing treatments of the lower insulating layer 5 are performed, a first ohmic conductive portion 4S is formed on the lower insulating layer 5 and in the source opening portion 5s of the lower insulating layer 5 so as to be in contact with the exposed surface 3s of the source electrode SE. When the exposed surface 3s of the source electrode SE is damaged, the first ohmic conductive portion 4S can stably form a contact with the exposed surface 3s of the source electrode SE. Therefore, compared with the case where the source electrode SE and the oxide semiconductor layer 7 are directly coupled to each other, it is possible to suppress an increase in contact resistance due to damage to the exposed surface 3s of the source electrode SE. Since the first ohmic conductive portion 4S is not damaged by the process of forming the lower insulating layer 5, it is possible to form a good ohmic contact between the first ohmic conductive portion 4S and the oxide semiconductor layer 7. Therefore, the contact resistance of the source contact portion can be reduced.

In the present embodiment, also when a metal film such as a Cu film or an Al film, which is difficult to form an ohmic contact with an oxide semiconductor, is used as the lower metal layer LM (uppermost layer in the case of having a laminated structure), the contact resistance of the source contact portion can be reduced. Therefore, it is possible to increase a degree of freedom in selecting the material and structure of the lower metal layer LM, the etching solution for the oxide semiconductor film, and the like.

The lower metal layer LM includes, for example, a low resistance metal layer (including an alloy layer) containing a low resistance metal such as Cu or Al, and the first ohmic conductive portion 4S is disposed so as to be in direct contact with the low resistance metal layer. The lower metal layer LM may have a single-layer structure of the low resistance metal layer, or may have a laminated structure (Cu/Ti structure or the like) having the low resistance metal layer as the uppermost layer. As a result, it possible to reduce the contact resistance of the source contact portion while suppressing the wiring resistance of the source bus line to be small.

Furthermore, when the source bus line SL contains Cu, Al, and the like, by providing the first ohmic conductive portion 4S of the ohmic layer OM, it is possible to prevent Cu and Al in the source bus line SL from diffusing into the oxide semiconductor layer 7. Therefore, the reliability of the TFT 20 can be improved.

In the illustrated example, no conductive portion is disposed in the ohmic layer OM at the intersection portion where the source bus line SL and the gate bus line GL intersect. For example, neither the first ohmic conductive portion 4S nor the second ohmic conductive portion 4D extends to the intersection portion. Therefore, it is possible to keep the capacitance at the intersection portion small.

MODIFICATION EXAMPLE

Modification Example 1

Figure 3A:
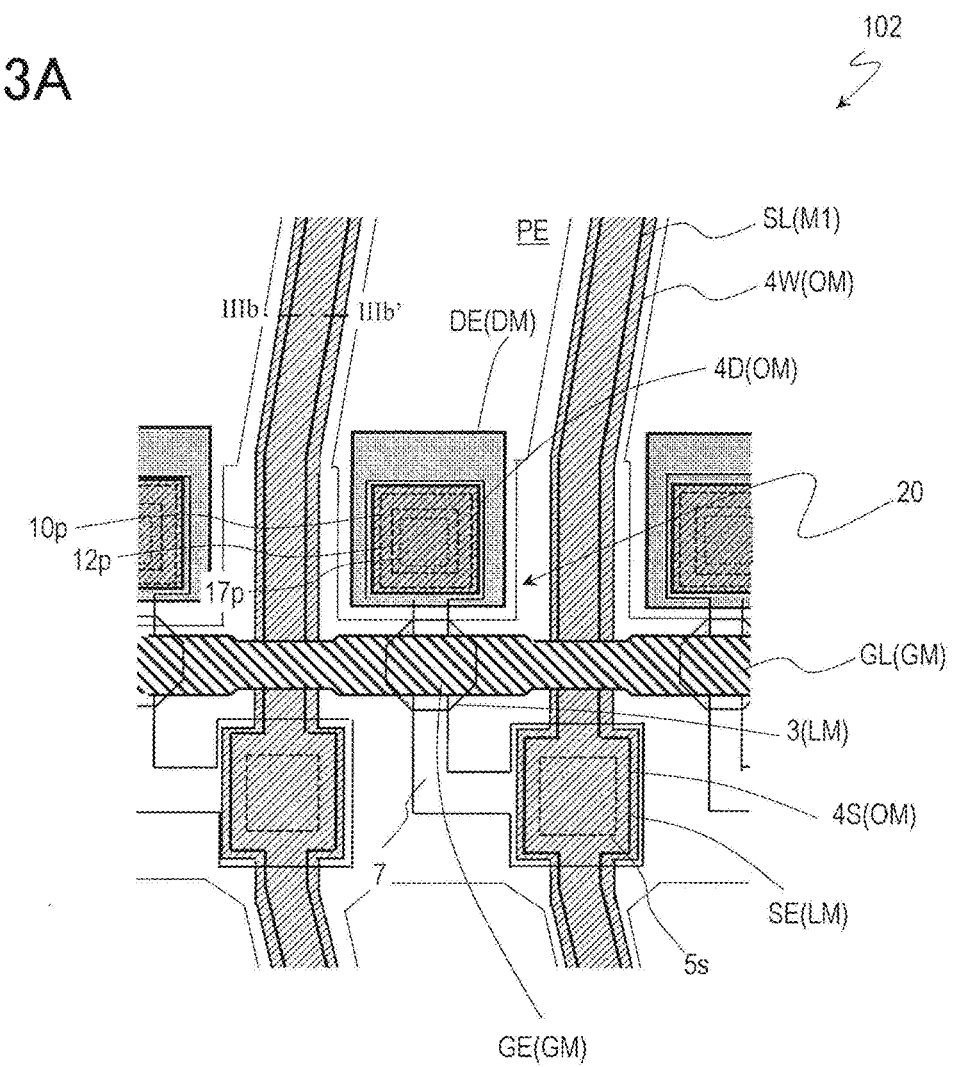
FIG. 3A is a plan view illustrating a pixel region in an active matrix substrate 102 according to Modification Example 1.
Figure 3B:
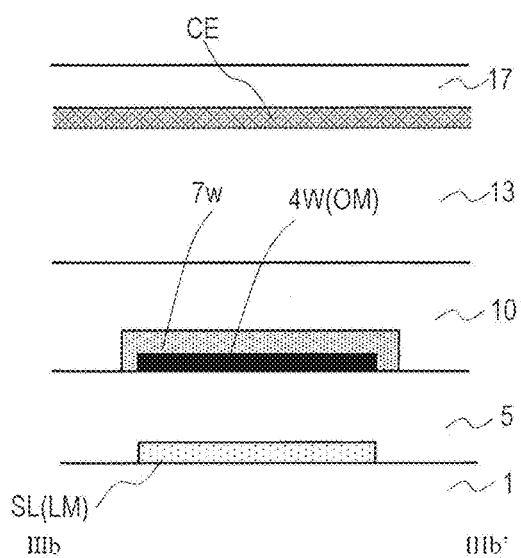
FIG. 3B is a diagram illustrating an example of a sectional structure of the active matrix substrate 102 taken along line IIIb-IIIb' illustrated in FIG. 3A.

FIG. 3A is a plan view illustrating a pixel region in an active matrix substrate 102 according to Modification Example 1, and FIG. 3B is a sectional view taken along line IIIb-IIIb' illustrated in FIG. 3A. Since a sectional view of the TFT 20 is similar to that of FIG. 2B, the sectional view will not be repeated.

The active matrix substrate 102 of Modification Example 1 is different from the active matrix substrate 101 in that the ohmic layer OM includes an ohmic wiring unit 4W extending in the first direction along the source bus line SL.

When viewed from the direction normal to the substrate 1, the ohmic wiring unit 4W extends from the source contact portion of one pixel region to the source contact portion of the pixel region adjacent in the first direction (a direction where a source bus line extends, here a column direction) so as to at least partially overlap the source bus line SL. The ohmic wiring unit 4W is coupled (formed integrally) to the first ohmic conductive portion 4S. In this example, the ohmic wiring units 4W are coupled to the first ohmic conductive portions 4S of the two TFTs 20, which are coupled to the same source bus line SL and are adjacent to each other in the first direction. As a result, the ohmic wiring unit 4W can also function as a source bus line, and therefore the source bus line SL having a redundant structure can be configured with both the ohmic layer OM and the lower metal layer LM, and the wiring resistance can be further reduced. The ohmic wiring unit 4W and the source bus line SL are provided in different metal layers and are separately patterned. Therefore, even when a disconnection occurs in one of the ohmic wiring unit 4W and the source bus line SL, the other can be automatically corrected.

The ohmic wiring unit 4W may be disposed on the source bus line SL with the lower insulating layer 5 therebetween. Although not illustrated, one or a plurality of contact portions that couple the ohmic wiring unit 4W and the source bus line SL may be provided between two source contact portions adjacent to each other in the first direction. At the contact portion, the ohmic wiring unit 4W may be disposed so as to be in direct contact with the source bus line SL in the opening portion formed in the lower insulating layer 5. Although not illustrated, an opening portion extending in the first direction may be formed in the lower insulating layer 5, and the ohmic wiring unit 4W may be in contact with the source bus line SL between the two source contact portions.

As illustrated in FIG. 3B, the ohmic wiring unit 4W may be covered with a wiring protection portion 7w formed of the same oxide semiconductor film as the oxide semiconductor layer 7. The entire upper surface and the entire side surface of the ohmic wiring unit 4W may be covered with the wiring protection portion 7w. As a result, since it is possible to prevent the surface of the ohmic wiring unit 4W from being damaged during the patterning (for example, wet etching) of the oxide semiconductor film, a redundant wiring structure with lower resistance and higher reliability can be obtained. The wiring protection portion 7w may extend in the first direction and may be coupled to the oxide semiconductor layers 7 of the two TFTs 20 adjacent to each other in the first direction, which are coupled to the corresponding source bus lines SL.

Figure 3C:
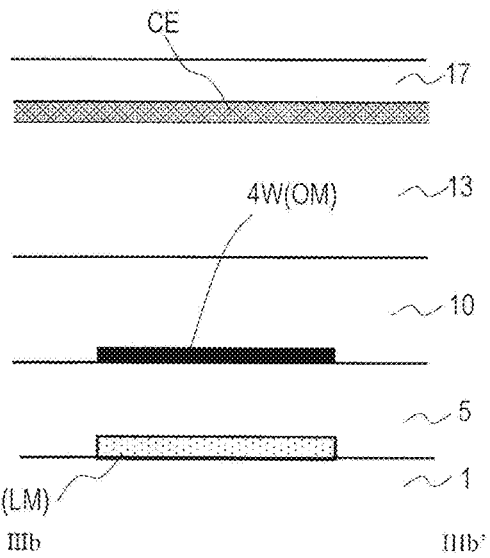
FIG. 3C is a diagram illustrating another example of the sectional structure of the active matrix substrate 102 taken along line IIIb-IIIb' illustrated in FIG. 3A.

Alternatively, as illustrated in FIG. 3C, (at least a portion of) the ohmic wiring unit 4W may not be covered with the oxide semiconductor film.

In the present modification example, it is possible to realize the redundant structure of the source bus line SL while reducing the contact resistance of the source contact portion. However, since the ohmic wiring unit 4W also exists at the intersection portion of the source bus line SL and the gate bus line GL, the capacitance at the intersection portion is larger than that of the active matrix substrate 101.

Modification Example 2

Figure 4A:
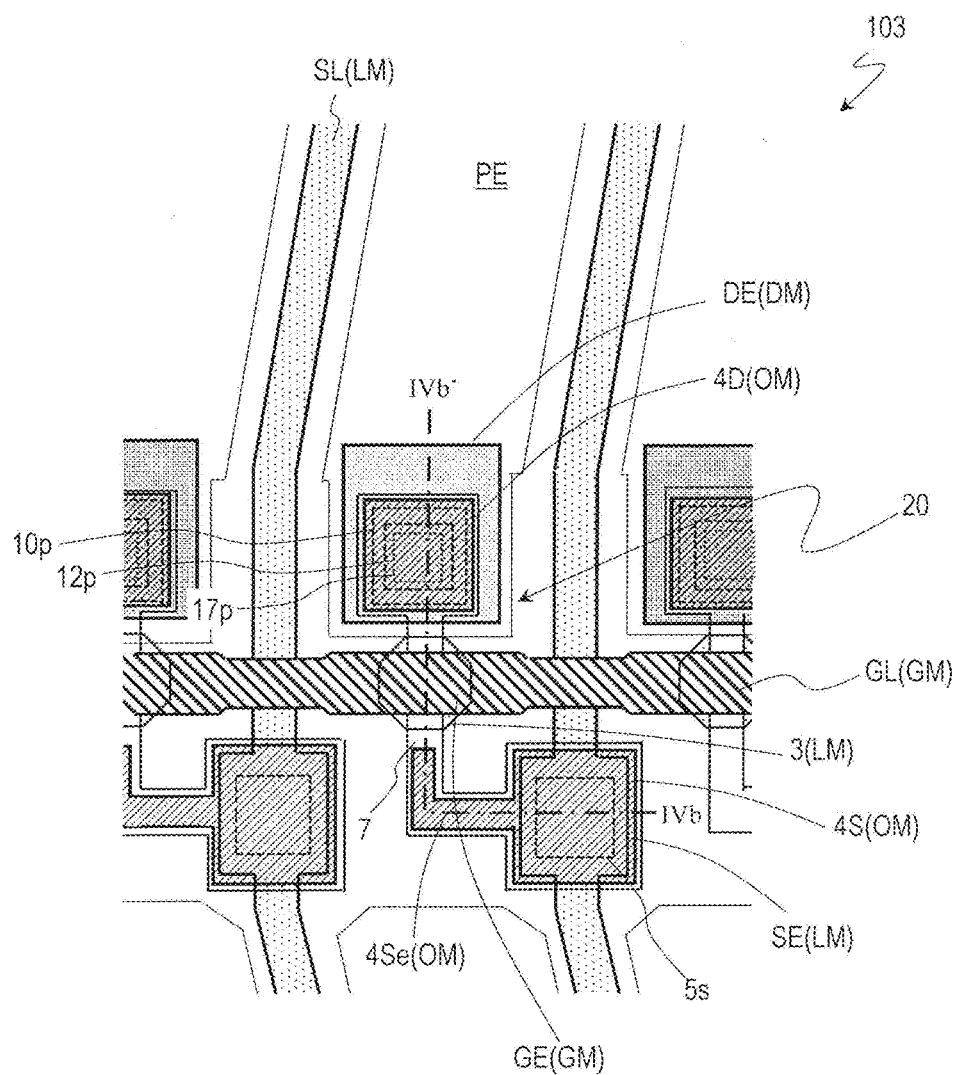
FIG. 4A is a plan view illustrating a pixel region in an active matrix substrate 103 according to Modification Example 2.
Figure 4B:
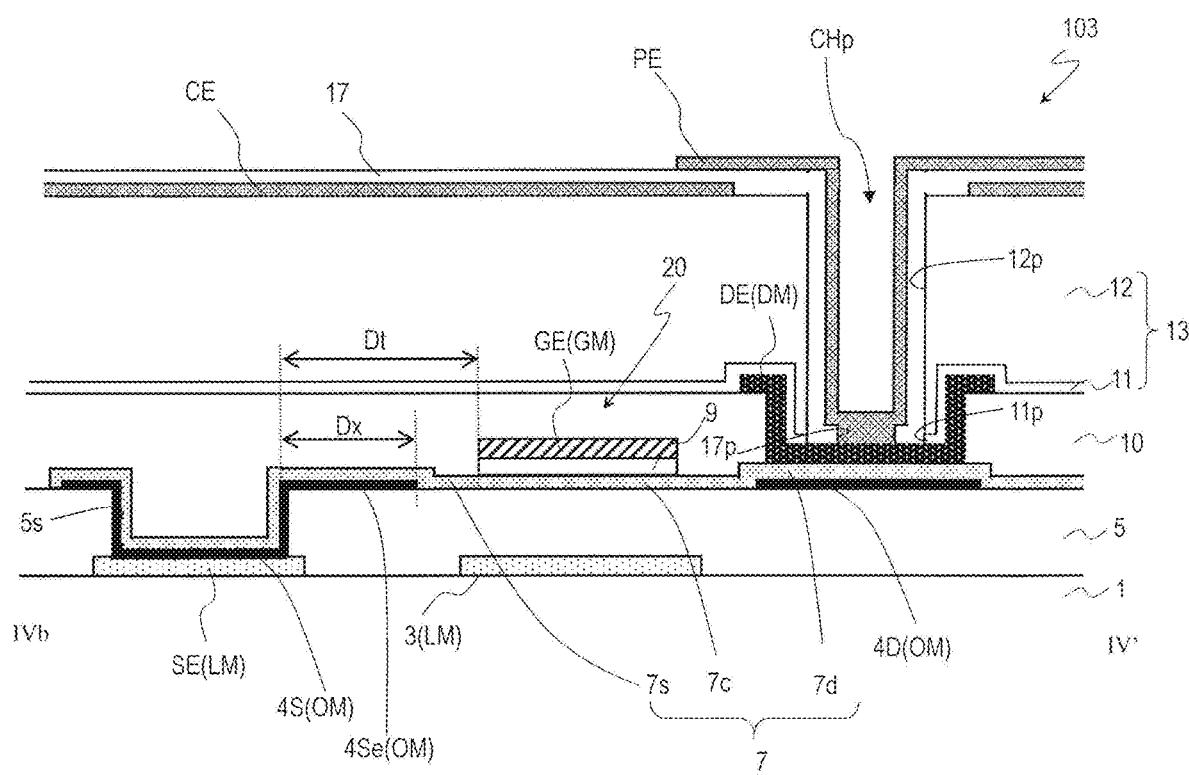
FIG. 4B is a sectional view of the active matrix substrate 103 taken along line IVb-IVb' illustrated in FIG. 4A.

FIG. 4A is a plan view illustrating a pixel region in the active matrix substrate 103 according to Modification Example 2, and FIG. 4B is a sectional view taken along line IVb-IVb' illustrated in FIG. 4A.

The active matrix substrate 103 of Modification Example 2 is different from the active matrix substrate 101 illustrated in FIGS. 2A and 2B in that the first ohmic conductive portion 4S extends beyond the peripheral edge of the source bus line SL (or source electrode SE) toward the channel region 7c side, when viewed from the direction normal to the substrate 1.

A portion 4Se of the first ohmic conductive portion 4S located closer to the channel region 7c than the source opening portion 5s is referred to as an "extended portion of the first ohmic conductive portion 4S". When a distance between the source opening portion 5s and the channel region 7c along the channel length direction is Dt, the length Dx of the extended portion 4Se in the channel length direction may be, for example, ½×Dt or more, and less than Dt.

By providing the extended portion 4Se, an area of a portion of the first region 7s of the oxide semiconductor layer 7, which is in contact with the first ohmic conductive portion 4S, is increased, and therefore a resistivity of the first region 7s of the oxide semiconductor layer 7 can be further reduced.

In order to prevent the extended portion 4Se from being damaged during patterning of the oxide semiconductor film, it is preferable that the entire extended portion 4Se of the first ohmic conductive portion 4S is covered with the oxide semiconductor layer 7. As illustrated in the drawing, when the length of the oxide semiconductor layer 7 in the channel width direction between the source contact portion and the channel region 7c is smaller than that of the source contact portion, the length of the first ohmic conductive portion 4S in the channel width direction may also be smaller than the length of the source contact portion in the channel width direction.

<Method for Manufacturing Active Matrix Substrate 101>

Hereinafter, a method for manufacturing the active matrix substrate 101 according to the present embodiment will be described with reference to the drawings.

FIGS. 5A to 5K are schematic step sectional views for describing a method for manufacturing the active matrix substrate 101.

Figure 5A:
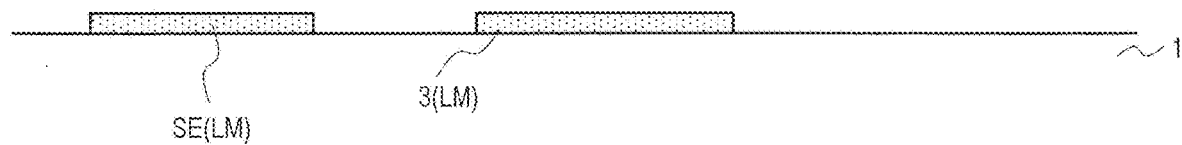
FIG. 5A is a step sectional view illustrating a method for manufacturing the active matrix substrate 101.

Step 1: Formation of Lower Metal Layer LM (FIG. 5A)

A source conductive film (thickness: 50 nm or more and 500 nm or less) is formed on the substrate 1 by, for example, a sputtering method. Next, the source conductive film is patterned by a known photolithography step. Here, a first resist layer (not illustrated) is formed by forming a resist film on the source conductive film and exposing the resist film using a first photomask. The source conductive film is etched (for example, wet etching) using the first resist layer as a mask.

AS described above, as illustrated in FIG. 5A, a lower metal layer LM including the source bus line SL, the source electrode SE, and the light shielding layer 3 of the TFT is formed.

As the substrate 1, a transparent and insulating substrate, for example, a glass substrate, a silicon substrate, a plastic substrate (resin substrate) having heat resistance, or the like can be used.

The material of the source conductive film is not particularly limited, and a film containing a metal such as aluminum (Al), tungsten (W), molybdenum (Mo), tantalum (Ta), chromium (Cr), titanium (Ti), or and copper (Cu), an alloy thereof, or a metal nitride thereof can be appropriately used. A laminated film in which a plurality of these films are laminated may be used.

Here, a single-layer film of a metal film (including an alloy film) containing Cu or Al is used as the source conductive film. Alternatively, a laminated film having a metal film containing Cu or Al as the uppermost layer may be used. As described above, in the present embodiment, the contact resistance between the source electrode SE and the oxide semiconductor can be reduced without providing an ohmic conductive film such as a Ti film on the Cu film or Al film.

Step 2: Formation of Lower Insulating Layer 5 (FIG. 5B)

Figure 5B:
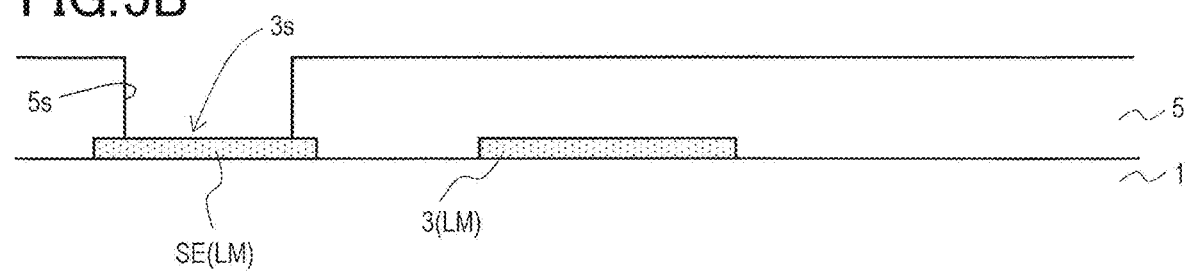
FIG. 5B is a step sectional view illustrating the method for manufacturing the active matrix substrate 101.

Next, as illustrated in FIG. 5B, the lower insulating layer 5 (thickness: 200 nm or more and 600 nm or less) is formed so as to cover the lower metal layer LM. Thereafter, the lower insulating layer 5 is patterned by a known photolithography step. As a result, in each pixel region, a source opening portion 5s exposing a portion 3s of the surface of the source electrode SE (or source bus line SL) is formed.

The lower insulating layer 5 is formed by, for example, a CVD method. As the lower insulating layer 5, a silicon oxide ($SiO_x$) layer, a silicon nitride ($SiN_x$) layer, a silicon oxynitride ($SiO_xN_y$; x>y) layer, a silicon nitride oxide ($SiN_xO_y$; x>y) layer, or the like can be appropriately used. The lower insulating layer 5 may be a single layer or may have a laminated structure. For example, a silicon nitride ($SiN_x$) layer, a silicon nitride oxide layer, or the like may be formed on the substrate side (lower layer) to prevent diffusion of impurities and the like from the substrate 1, and a silicon oxide ($SiO_2$) layer, a silicon oxynitride layer, or the like may be formed on a layer thereover (upper layer) to secure insulation. Here, as the lower insulating layer 5, for example, a silicon oxide ($SiO_2$) layer (thickness: 350 nm, for example) is formed by using the CVD method. Alternatively, as the lower insulating layer 5, a laminated film having a silicon nitride ($SiN_x$) layer (thickness: 50 to 600 nm) as a lower layer and a silicon oxide ($SiO_2$) layer (thickness: 50 to 600 nm) as an upper layer may be formed. When an oxide film such as a silicon oxide film is used as the lower insulating layer 5 (in a case where the lower insulating layer 5 has a laminated structure, as an uppermost layer), since oxidation deficiency generated in a channel region of an oxide semiconductor layer formed later can be reduced by the oxide film, reduction in resistance of the channel region can be suppressed.

After forming the lower insulating layer 5 and before patterning the lower insulating layer 5, an annealing treatment may be performed to improve the reliability of the lower insulating layer 5. The annealing treatment is performed in the atmosphere at a temperature of 200 to 450° C., for example.

As described above, in this step, the surface 3s of the source electrode SE may be damaged when the lower insulating layer 5 is patterned. When an oxide film is used as the lower insulating layer 5, the surface of the lower metal layer LM may be damaged by oxygen in the oxide film.

Figure 5C:
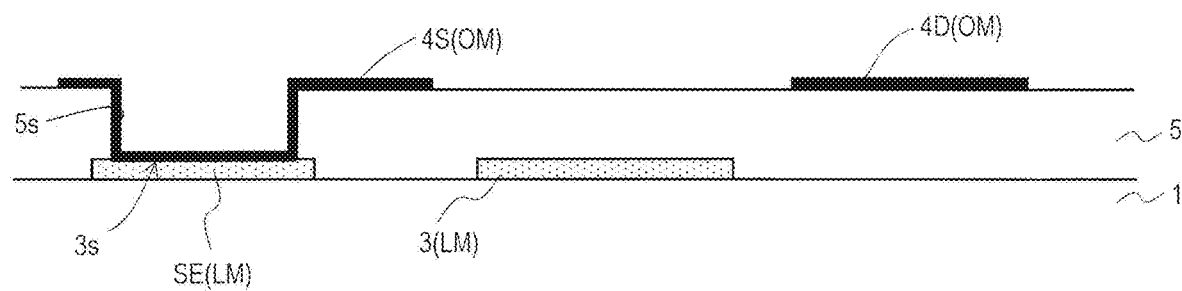
FIG. 5C is a step sectional view illustrating the method for manufacturing the active matrix substrate 101.

Step 3: Formation of Ohmic Layer OM (FIG. 5C)

Next, an ohmic conductive film is formed on the lower insulating layer 5 and in the source opening portion 5s, and the ohmic conductive film is patterned. As a result, as illustrated in FIG. 5C, in the source opening portion 5s, an ohmic layer OM including a first ohmic conductive portion 4S in contact with the exposed surface 3s of the source electrode SE (or source bus line SL) and a second ohmic conductive portion 4D located in a region where a pixel contact hole is formed in a later step is obtained.

The ohmic conductive film may be a metal film (thickness: for example, 10 nm or more and 80 nm or less) that easily forms an ohmic contact with an oxide semiconductor (for example, In—Ga—Zn—O based semiconductor). Examples of such a metal film include a Ti film, a Mo film, a Ta film, a W film, and the like. In particular, a Ti film or a Mo film, which is advantageous for taking out electrons from the oxide semiconductor layer 7, may be preferably used. The metal film is formed by, for example, a sputtering method. Alternatively, as the ohmic conductive film, a metal oxide film (thickness: for example, 10 nm or more and 100 nm or less) such as an indium tin oxide (ITO) film, an indium zinc oxide (In—Zn—O) film, a zinc oxide (ZnO) film, a tin oxide ($SnO_2$) film may be used. The metal oxide film may be formed by, for example, a sputtering method.

Figure 5D:
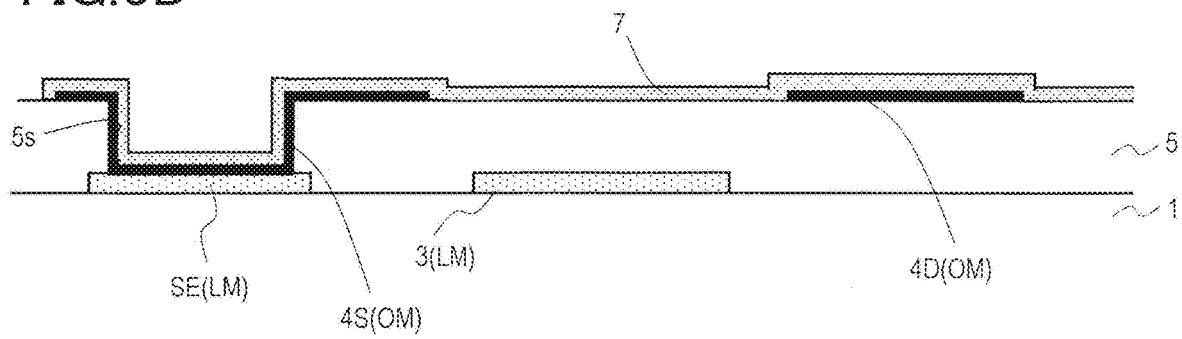
FIG. 5D is a step sectional view illustrating the method for manufacturing the active matrix substrate 101.

Step 4: Formation of Oxide Semiconductor Layer 7 (FIG. 5D)

Subsequently, an oxide semiconductor film (thickness: for example, 15 nm or more and 200 nm or less) is formed on the lower insulating layer 5 and the ohmic layer OM. Thereafter, annealing treatment of the oxide semiconductor film may be performed. Subsequently, patterning of the oxide semiconductor film is performed by a known photolithography step. As a result, as illustrated in FIG. 5D, an oxide semiconductor layer 7 to be an active layer of the TFT 20 is obtained. The oxide semiconductor layer 7 is in direct contact with the first ohmic conductive portion 4S and the second ohmic conductive portion 4D. The oxide semiconductor layer 7 may cover the entire first ohmic conductive portion 4S and the entire second ohmic conductive portion 4D.

The oxide semiconductor film can be formed by, for example, a sputtering method. Here, an In—Ga—Zn—O-based semiconductor film (thickness: 50 nm) containing In, Ga, and Zn is formed as the oxide semiconductor film.

The patterning of the oxide semiconductor film may be performed by wet etching using a PAN-based etching solution containing phosphoric acid, nitric acid, and acetic acid, for example. Alternatively, another etching solution such as an oxalic acid-based etching solution may be used.

Step 5: Formation of Gate Insulating Layer 9 and Gate Metal Layer GM (FIG. 5E)

Figure 5E:
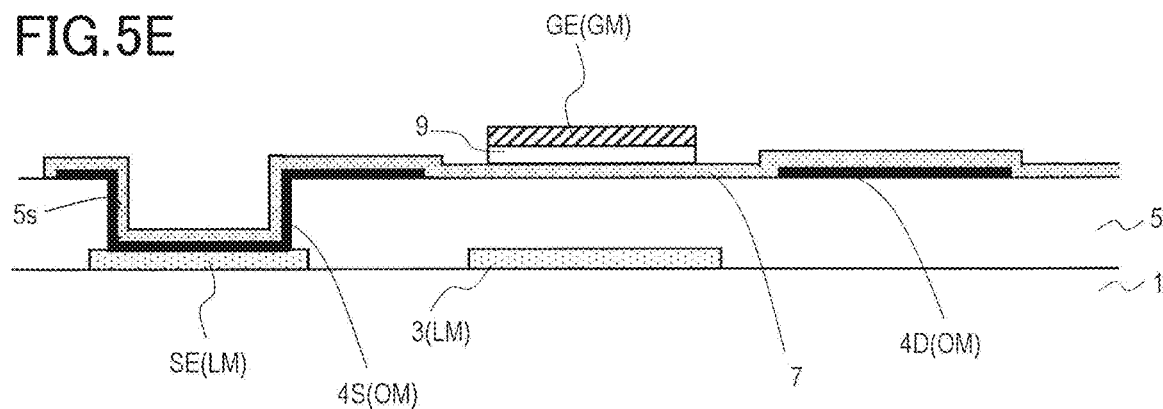
FIG. 5E is a step sectional view illustrating the method for manufacturing the active matrix substrate 101.

Next, as illustrated in FIG. 5E, a gate insulating layer 9 and a gate metal layer GM are formed on the oxide semiconductor layer 7.

First, a gate insulating film (thickness: for example, 80 nm or more and 250 nm or less) and a gate conductive film (thickness: for example, 50 nm or more and 500 nm or less) are formed in this order so as to cover the oxide semiconductor layer 7. Thereafter, by performing patterning of the gate conductive film by a known photolithography step, a gate metal layer GM including the gate bus line GL, the gate electrode GE, and the like is formed. Next, the gate insulating film and the gate conductive film are patterned using the same resist mask as the patterning of the gate conductive film (or using gate metal layer GM as a mask) to form a gate insulating layer 9. According to this method, the side surfaces of the gate electrode GE and the side surfaces of the gate insulating layer 9 are coincided with each other when viewed from the direction normal to the substrate 1.

Instead of the above method, first, a gate insulating film may be formed so as to cover the oxide semiconductor layer 7, and the gate insulating film may be patterned to form a gate insulating layer 9. Next, a gate conductive film may be formed so as to cover the gate insulating layer 9, and the gate conductive film may be patterned to form a gate metal layer GM.

As the gate insulating film, an insulating film similar to the lower insulating layer 5 (insulating film exemplified as the lower insulating layer 5) can be used. Here, a silicon oxide ($SiO_2$) layer is formed as the gate insulating film. When an oxide film such as a silicon oxide film is used as the insulating film, since oxidation deficiency generated in the channel region of the oxide semiconductor layer 7 can be reduced by the oxide film, reduction in resistance of the channel region 7c can be suppressed.

As the gate conductive film, for example, a metal such as molybdenum (Mo), tungsten (W), aluminum (Al), copper (Cu), titanium (Ti), tantalum (Ta), or an alloy thereof can be used. The gate conductive film may have a laminated structure including a plurality of layers formed of different conductive materials.

Figure 5F:
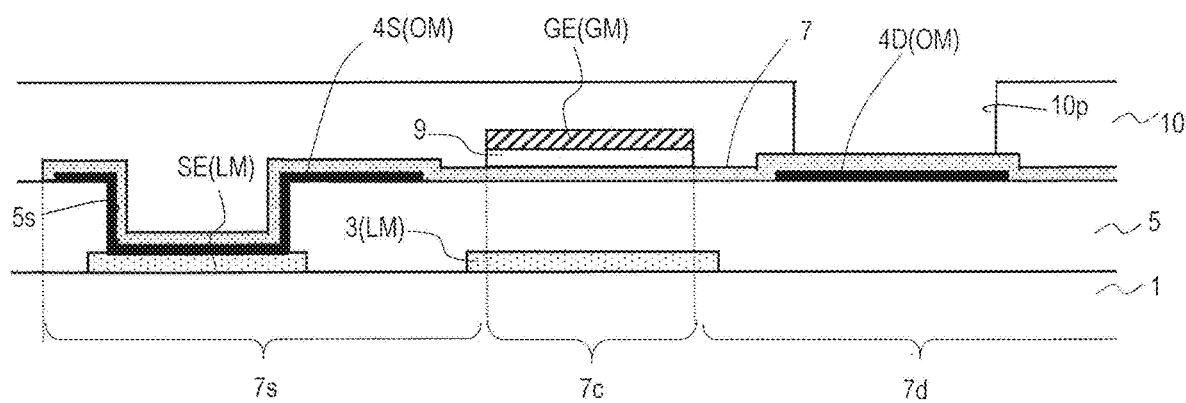
FIG. 5F is a step sectional view illustrating the method for manufacturing the active matrix substrate 101.

Step 6: Resistance Lowering Treatment and Formation of Interlayer Insulating Layer 10 (FIG. 5F)

Subsequently, a resistance lowering treatment of the oxide semiconductor layer 7 is performed. For example, as the resistance lowering treatment, a plasma treatment may be performed. As a result, as illustrated in FIG. 5F, when viewed from the direction normal to the main surface of the substrate 1, a region of the oxide semiconductor layer 7, which does not overlap the gate bus line GL and the gate insulating layer 9 is a low resistance region having a lower resistivity than that of a region that overlaps these line and layer (here, region to be the channel). The low resistance region may be a conductor region (for example, sheet resistance: 200Ω/□ or less). AS described above, the oxide semiconductor layer 7 including the first region 7s and the second region 7d, which are low resistance regions, and the channel region 7c remaining as a semiconductor region without being reduced in resistance is obtained.

In the resistance lowering treatment (plasma treatment), a portion of the oxide semiconductor layer 7 that is not covered with the gate bus line GL or the gate insulating layer 9 may be exposed to reducing plasma or plasma containing a doping element (for example, argon plasma). As a result, the resistance is reduced near the surface of the exposed portion of the oxide semiconductor layer 7, and the oxide semiconductor layer 7 is a low resistance region. A portion of the oxide semiconductor layer 7 which is masked by the gate bus line GL or the gate insulating layer 9 remains as a semiconductor region. The method and conditions for the resistance lowering treatment are described in, for example, Japanese Unexamined Patent Application Publication No. 2008-40343. For reference, the entire content of the disclosure of Japanese Unexamined Patent Application Publication No. 2008-40343 is incorporated herein.

Next, an interlayer insulating layer 10 covering the oxide semiconductor layer 7, the gate insulating layer 9, and the gate electrode GE is formed. Thereafter, a drain opening portion 10p exposing a portion of the second region 7d of the oxide semiconductor layer 7 is formed in the interlayer insulating layer 10 by, for example, dry etching.

As the interlayer insulating layer 10, an inorganic insulating layer such as a silicon oxide film, a silicon nitride film, a silicon oxynitride film, a silicon nitride oxide film, or the like can be formed as a single layer or a laminated layer. The thickness of the inorganic insulating layer may be 100 nm or more and 500 nm or less. When the interlayer insulating layer 10 is formed using an insulating film such as a silicon nitride film that reduces an oxide semiconductor, this is preferable because the resistivity of a region (here, a low resistance region) in contact with the interlayer insulating layer 10 in the oxide semiconductor layer 7 can be maintained low. Here, as the interlayer insulating layer 10, for example, a $SiN_x$ layer (thickness: 300 nm) is formed by a CVD method.

In a case where an insulating layer that can reduce an oxide semiconductor (for example, hydrogen-donating layer such as a silicon nitride layer) is used as the interlayer insulating layer 10, even without performing the above-described resistance lowering treatment, a portion of the oxide semiconductor layer 7 that is in contact with the interlayer insulating layer 10 can have a lower resistance than a portion that is not in contact.

Figure 5G:
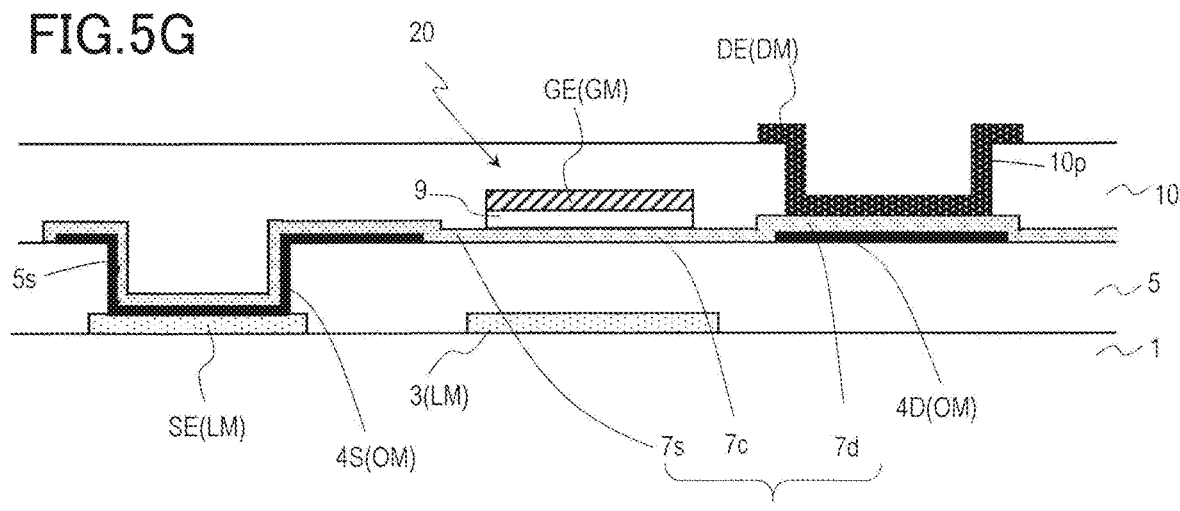
FIG. 5G is a step sectional view illustrating the method for manufacturing the active matrix substrate 101.

Step 7: Formation of Drain Metal Layer DM (FIG. 5G)

Next, a drain conductive film (thickness: for example, 50 nm or more and 500 nm or less) is formed on the interlayer insulating layer 10, and the drain conductive film is patterned. As a result, as illustrated in FIG. 5G, a drain metal layer DM including the drain electrode DE is formed. The drain electrode DE is disposed on the interlayer insulating layer 10 and in the drain opening portion 10p, and is in contact with the second region 7d of the oxide semiconductor layer 7 in the drain opening portion 10p. Here, the drain electrode DE is disposed so as to at least partially overlap the second ohmic conductive portion 4D when viewed from the direction normal to the substrate 1.

As the drain conductive film, for example, an element selected from aluminum (Al), chromium (Cr), copper (Cu), tantalum (Ta), titanium (Ti), molybdenum (Mo), or tungsten (W), or an alloy containing these elements as components can be used. For example, the drain conductive film may have a three-layer structure of a titanium film-aluminum film-titanium film, a three-layer structure of a molybdenum film-aluminum film-molybdenum film, or the like. The drain conductive film is not limited to the three-layer structure and may have a single-layer structure, a two-layer structure, or a laminated structure of four or more layers. Here, a laminated film in which a Ti film (thickness: 15 to 70 nm) is a lower layer and a Cu film (thickness: 200 to 400 nm) is an upper layer is used.

Step 8: Formation of Inorganic Insulating Layer 11 and Organic Insulating Layer 12 (FIG. 5H)

Figure 5H:
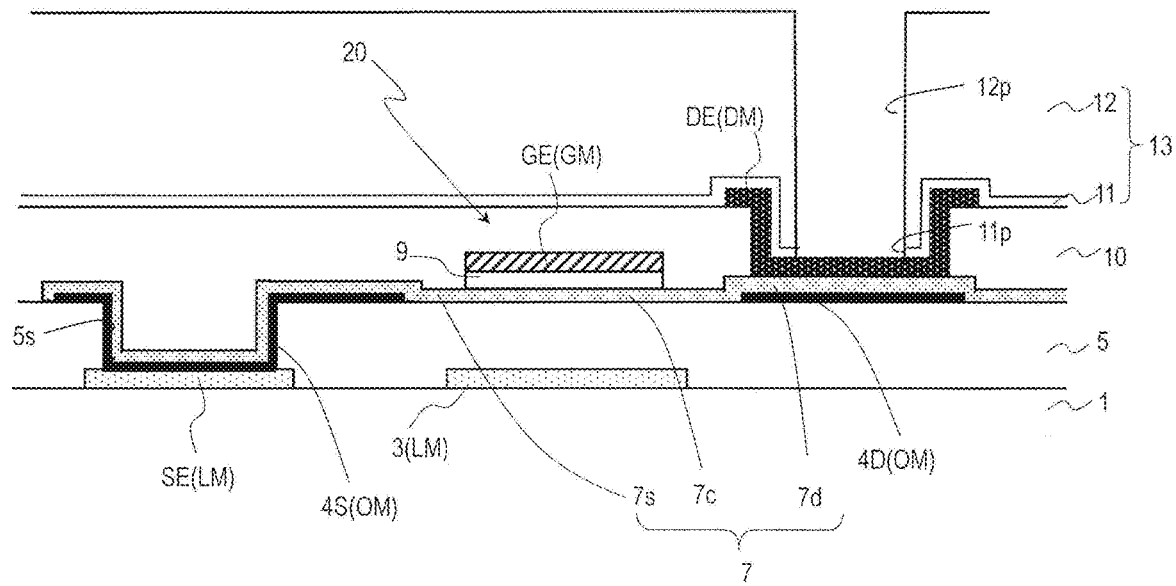
FIG. 5H is a step sectional view illustrating the method for manufacturing the active matrix substrate 101.

Next, as illustrated in FIG. 5H, an upper insulating layer 13 is formed so as to cover the interlayer insulating layer 10 and the drain metal layer DM. Here, as the upper insulating layer 13, an inorganic insulating layer 11 (thickness: for example, 100 nm or more and 500 nm or less) and an organic insulating layer 12 (thickness: for example, 1 to 3 μm, preferably 2 to 3 μm) are formed in this order. The entire portion of the organic insulating layer 12 located in the non-display region may be removed. Alternatively, the organic insulating layer 12 may not be formed.

As the inorganic insulating layer 11, the inorganic insulating film similar to the interlayer insulating layer 10 (insulating film exemplified as the interlayer insulating layer 10) can be used. Here, as the inorganic insulating layer 11, for example, a $SiN_x$ layer (thickness: 300 nm) is formed by a CVD method. The organic insulating layer 12 may be, for example, an organic insulating film (for example, acrylic resin film) containing a photosensitive resin material.

Thereafter, patterning of the organic insulating layer 12 is performed. As a result, in each pixel region PIX, an opening portion 12p exposing a portion of the inorganic insulating layer 11 is formed in the organic insulating layer 12. The opening portion 12p is disposed so as to overlap the drain electrode DE when viewed from the direction normal to the substrate 1. Thereafter, the inorganic insulating layer 11 is etched using the organic insulating layer 12 as a mask, and an opening portion 11p exposing the drain electrode DE is provided in the inorganic insulating layer 11.

Although not illustrated, the etching of the inorganic insulating layer 11 may be performed simultaneously with the etching of the dielectric layer 17 described later. As a result, the common electrode CE and the dielectric layer 17 can be formed with the surface of the drain electrode DE protected by the inorganic insulating layer 11.

Step 9: Formation of Common Electrode CE (FIG. 5I)

Figure 5I:
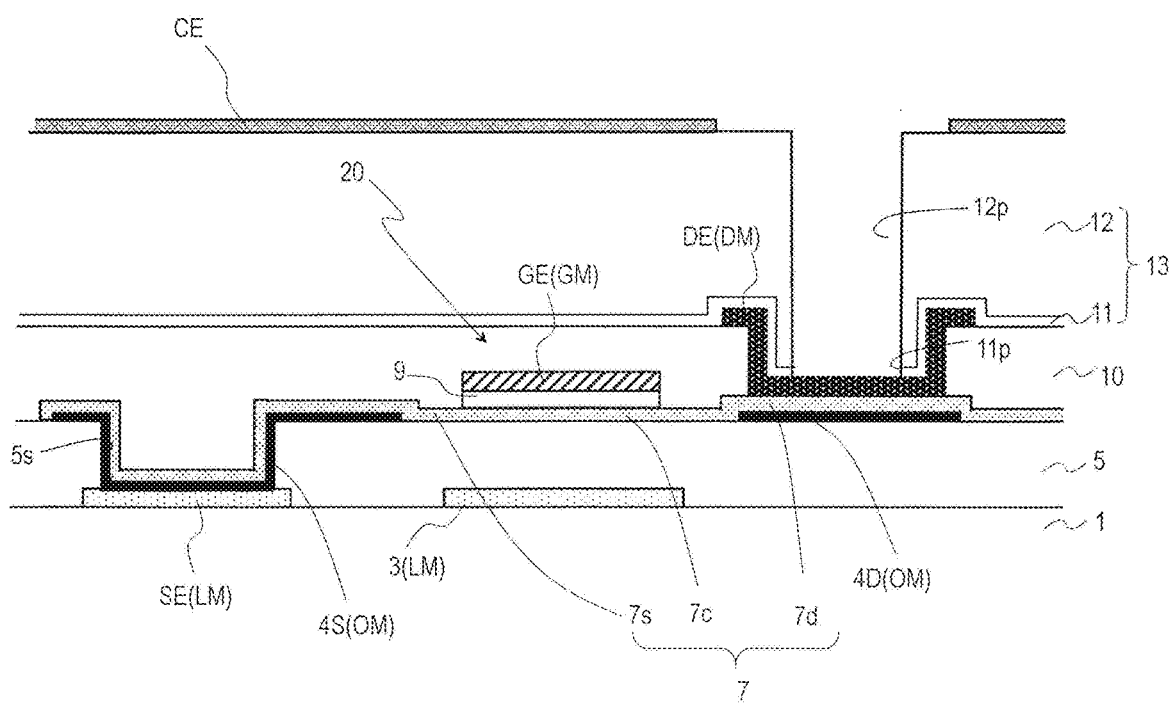
FIG. 5I is a step sectional view illustrating the method for manufacturing the active matrix substrate 101.

Subsequently, as illustrated in FIG. 5I, a common electrode CE is formed on the upper insulating layer 13.

First, a first transparent conductive film (not illustrated) (thickness: 20 to 300 nm) is formed on the upper insulating layer 13 and in the opening portion 12p and 11p. Here, for example, an indium-zinc oxide film is formed as the second transparent conductive film by a sputtering method. As a material of the first transparent conductive film, a metal oxide such as indium-tin oxide (ITO), indium-zinc oxide, or ZnO can be used. Thereafter, patterning of the first transparent conductive film is performed. In patterning, for example, wet etching may be performed using an oxalic acid-based etching solution. As a result, the common electrode CE is obtained. The common electrode CE may be disposed, for example, over substantially the entire display region except for the pixel contact hole forming region where the pixel contact hole CHp is formed.

Step 10: Formation of Dielectric Layer 17 (FIG. 5J)

Figure 5J:
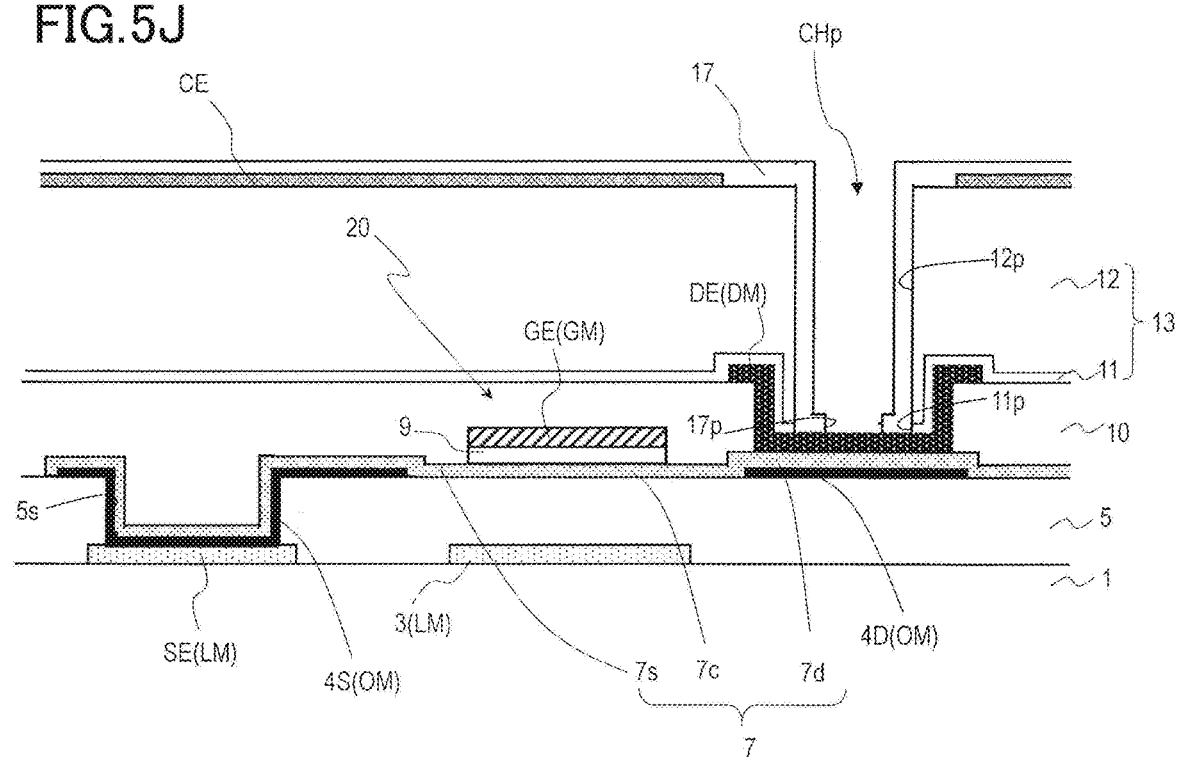
FIG. 5J is a step sectional view illustrating the method for manufacturing the active matrix substrate 101.

Next, as illustrated in FIG. 5J, a dielectric layer (thickness: 50 to 500 nm) 17 is formed so as to cover the common electrode CE, and patterning of the dielectric layer 17 and the inorganic insulating layer 11 are performed.

The dielectric layer 17 is formed on the organic insulating layer 12 and the common electrode CE and in the opening portions 12p and 11p in the pixel region PIX. The material of the dielectric layer 17 may be the same as the material exemplified as the material of the inorganic insulating layer 11. Here, a SiN film is formed as the dielectric layer 17 by, for example, a CVD method.

Thereafter, the dielectric layer 17 is etched by a known photolithography step to form an opening portion 17p. The opening portion 17p may be at least partially overlapped the opening portions 12p and 11p when viewed from the direction normal to the substrate 1. As a result, a pixel contact hole CHp exposing a portion of the second region 7d of the oxide semiconductor layer 7 is formed in the pixel region. The pixel contact hole CHp is configured to include the opening portion 11p formed in the inorganic insulating layer 11, the opening portion 12p in the organic insulating layer 12, and the opening portion 17p in the dielectric layer 17.

Figure 5K:
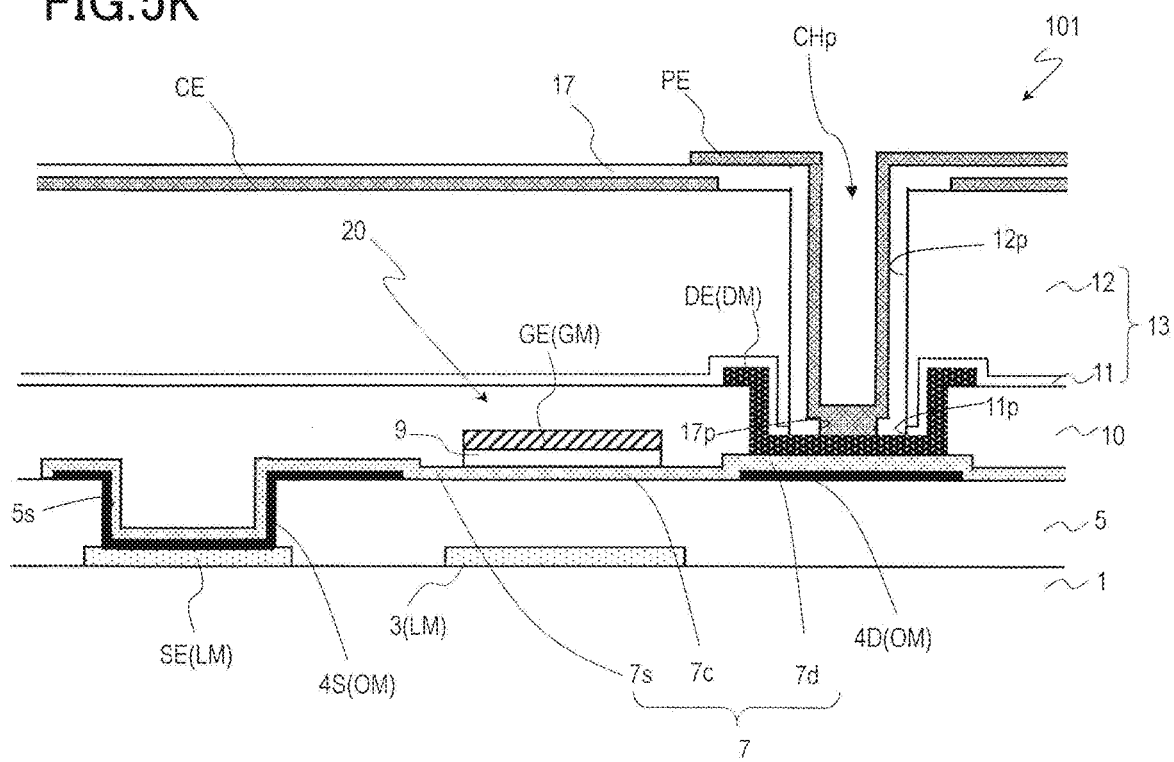
FIG. 5K is a step sectional view illustrating the method for manufacturing the active matrix substrate 101.

Step 11: Formation of Pixel Electrode PE (FIG. 5K)

Next, a second transparent conductive film (thickness: 20 to 300 nm) (not illustrated) is formed on the dielectric layer 17 and in the pixel contact hole CHp, and the second transparent conductive film is patterned. As a result, the pixel electrode PE is formed in each pixel region as illustrated in FIG. 5K. The material of the second transparent conductive film may be the same as the material exemplified as the material of the first transparent conductive film. Here, for example, wet etching of the second transparent conductive film may be performed using an oxalic acid-based etching solution. The pixel electrode PE is formed on the dielectric layer 17 and in the pixel contact hole CHp, and is in contact with the second region 7d in the pixel contact hole CHp. As described above, the active matrix substrate 101 is manufactured.

<Another Active Matrix Substrate>

Figure 6A:
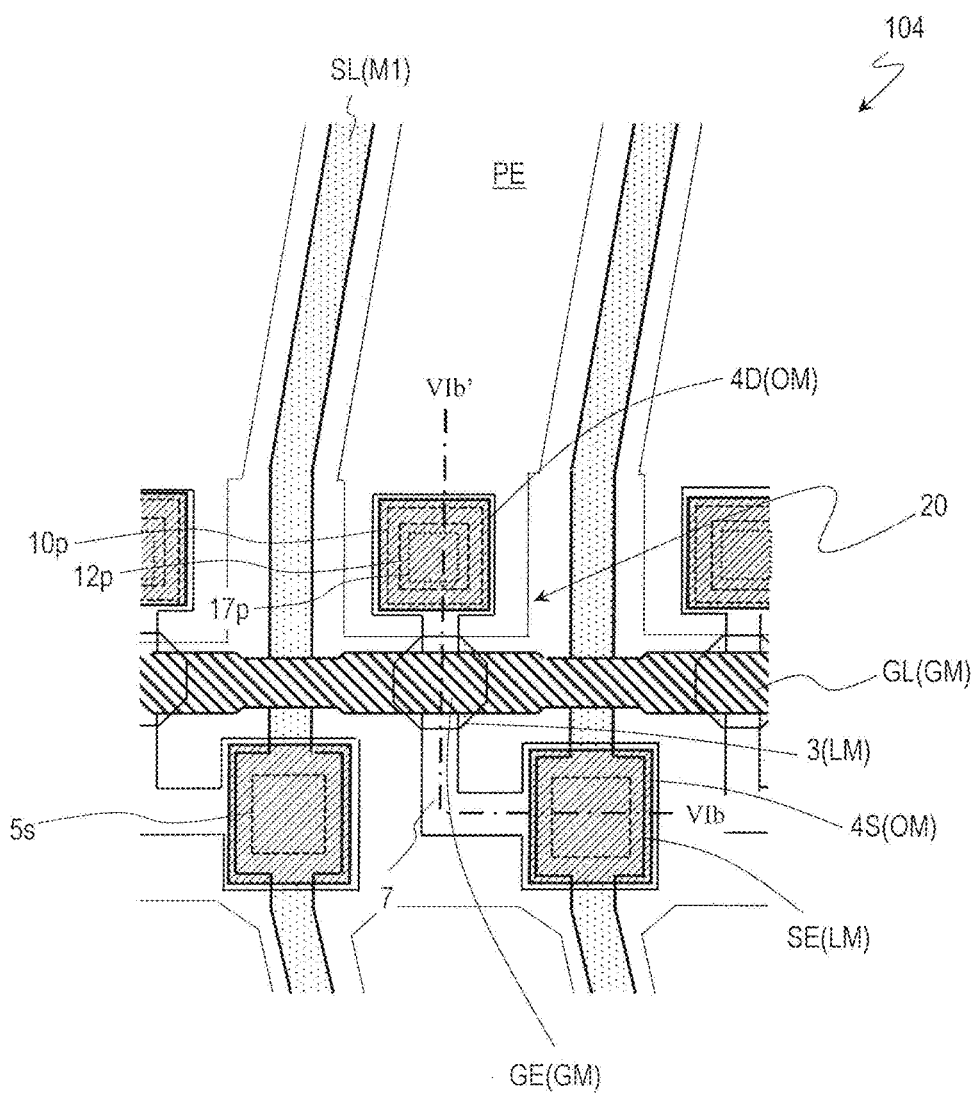
FIG. 6A is a plan view illustrating a pixel region in another active matrix substrate 104.
Figure 6B:
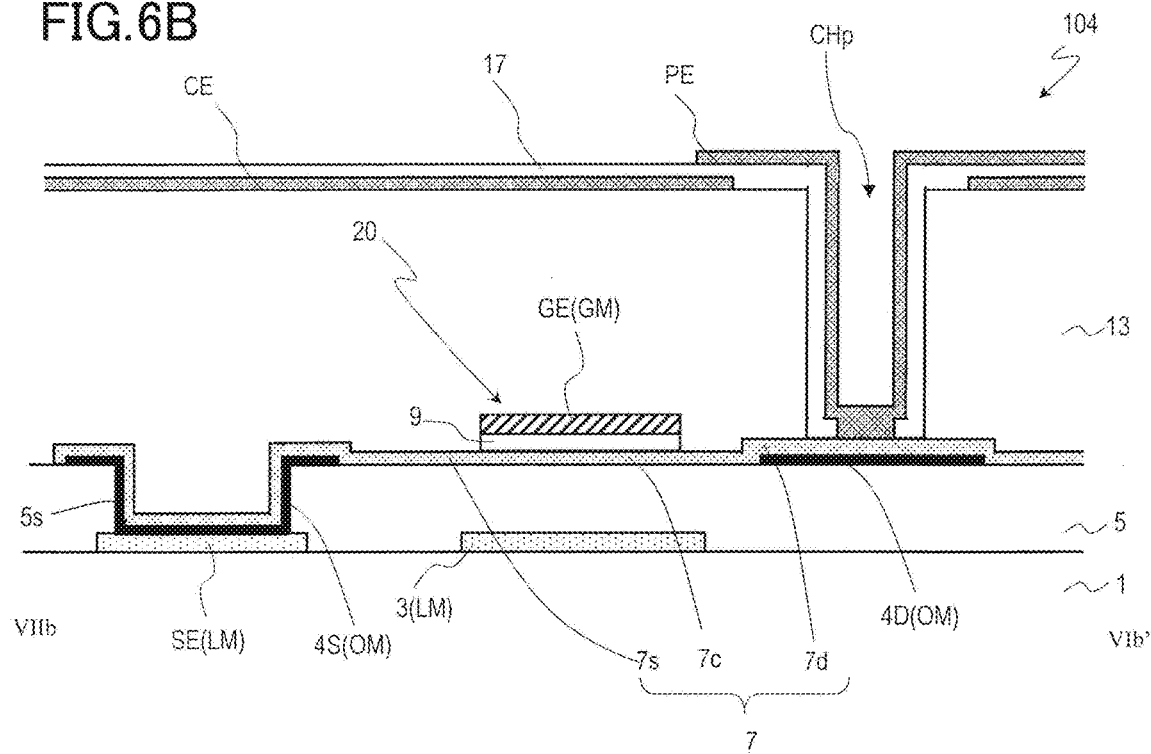
FIG. 6B is a diagram illustrating an example of a sectional structure in the active matrix substrate 104, which is taken along line VIb-VIb' illustrated in FIG. 6A.

The structure of the active matrix substrate according to the present embodiment is not limited to the structure illustrated in FIGS. 2A to 4B. The active matrix substrate according to the present embodiment may have a source contact portion using the ohmic layer OM, and FIGS. 6A and 6B in which various modifications can be made as illustrated below are sectional views illustrating a pixel region of another active matrix substrate 104, respectively.

The active matrix substrate 104 is different from the active matrix substrate 101 of the first embodiment in that the active matrix substrate 104 does not have the drain electrode DE and the interlayer insulating layer 10.

In the active matrix substrate 104, an upper insulating layer 13 is formed so as to cover the oxide semiconductor layer 7, the gate metal layer GM, and the TFT 20. The pixel electrode PE is direct contact with the second region 7d of the oxide semiconductor layer 7 in the pixel contact hole CHp formed in the upper insulating layer 13 and the dielectric layer 17.

The active matrix substrate 104 may not have the drain metal layer DM. By reducing the number of drain metal layers DM, the number of photomasks used can be reduced, and therefore the manufacturing cost can be reduced.

Figure 6C:
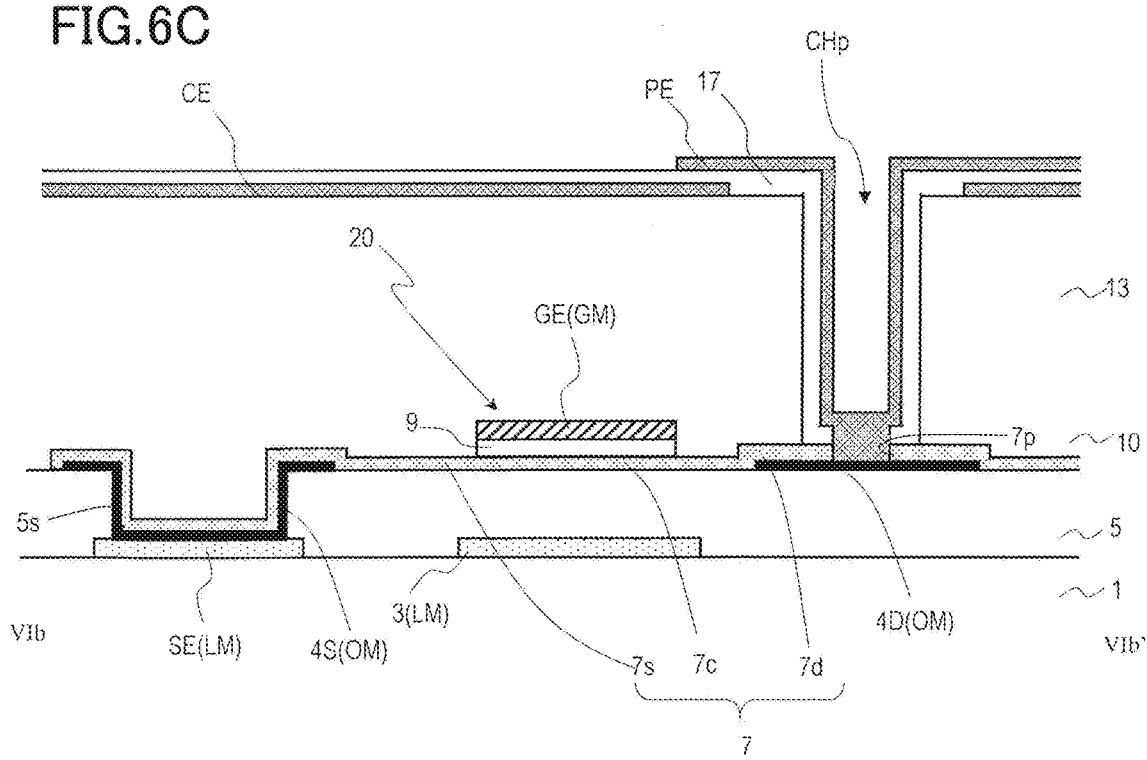
FIG. 6C is a diagram illustrating another example of the sectional structure of the active matrix substrate 104, which is taken along line VIb-VIb' illustrated in FIG. 6A.

As illustrated in FIG. 6C, when forming the pixel contact hole CHp, an opening portion 7p may be formed in the oxide semiconductor layer 7 to expose the surface of the second ohmic conductive portion 4D. In this case, the pixel electrode PE may be disposed in the pixel contact hole CHp so as to be in direct contact with the exposed surface of the second ohmic conductive portion 4D. As a result, a more stable and low resistance source contact portion can be obtained.

Figure 7:
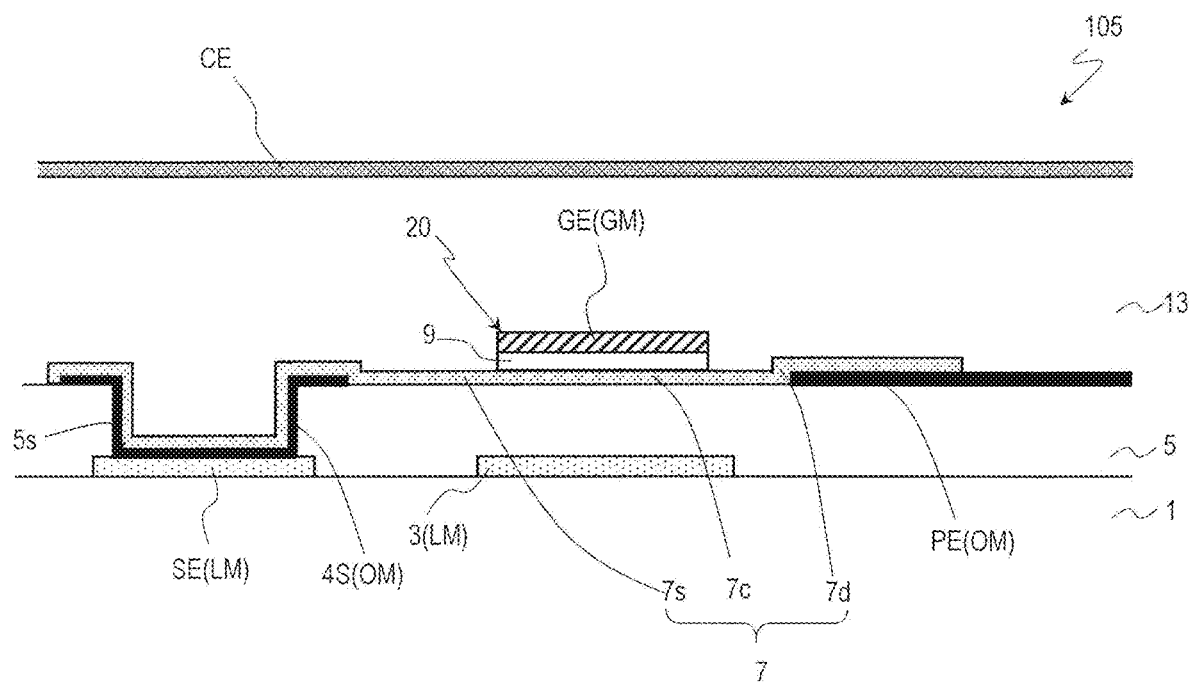
FIG. 7 is a sectional view illustrating a pixel region in still another active matrix substrate 105.

FIG. 7 is a sectional view illustrating a pixel region in still another active matrix substrate 105.

When a transparent conductive film (for example, transparent metal oxide film) is used as the ohmic conductive film for forming the ohmic layer OM, the pixel electrode PE may be formed in the ohmic layer OM as illustrated in FIG. 7. The pixel electrode PE is disposed on the lower insulating layer 5. A portion of the pixel electrode PE is located between the lower insulating layer 5 and the oxide semiconductor layer 7, and is in contact with the lower surface of the second region 7d of the oxide semiconductor layer 7. The common electrode CE is disposed on the upper insulating layer 13. Here, for example, a silicon nitride (SiNx) layer (for example, thickness: 200 nm or more and 800 nm or less) is used as the upper insulating layer 13.

According to the configuration illustrated in FIG. 7, the dielectric layer and the transparent electrode layer may not be provided on the common electrode CE. Therefore, since the number of photomasks can be reduced by 2, the manufacturing cost can be reduced.

<Wiring Using Ohmic Layer OM>

The active matrix substrate according to the present embodiment may have wiring (electrode or wiring) formed by using the ohmic layer OM in the non-display region, for example. Such wiring may be formed only of the ohmic layer OM, or may have a redundant structure with other metal layers (lower metal layer LM, gate metal layer GM, and drain metal layer DM).

The wiring using the ohmic layer OM can be used, for example, in a gate driver circuit monolithically formed in the non-display region. Hereinafter, an example of a gate driver circuit including wiring using the ohmic layer OM will be described with reference to the drawings.

Circuit Configuration of Gate Driver

First, a circuit configuration and operation of the gate driver GD formed on the active matrix substrate 101 will be described. The gate driver GD includes a shift register. The shift register includes a plurality of unit circuits coupled in multiple stages.

Figure 8:
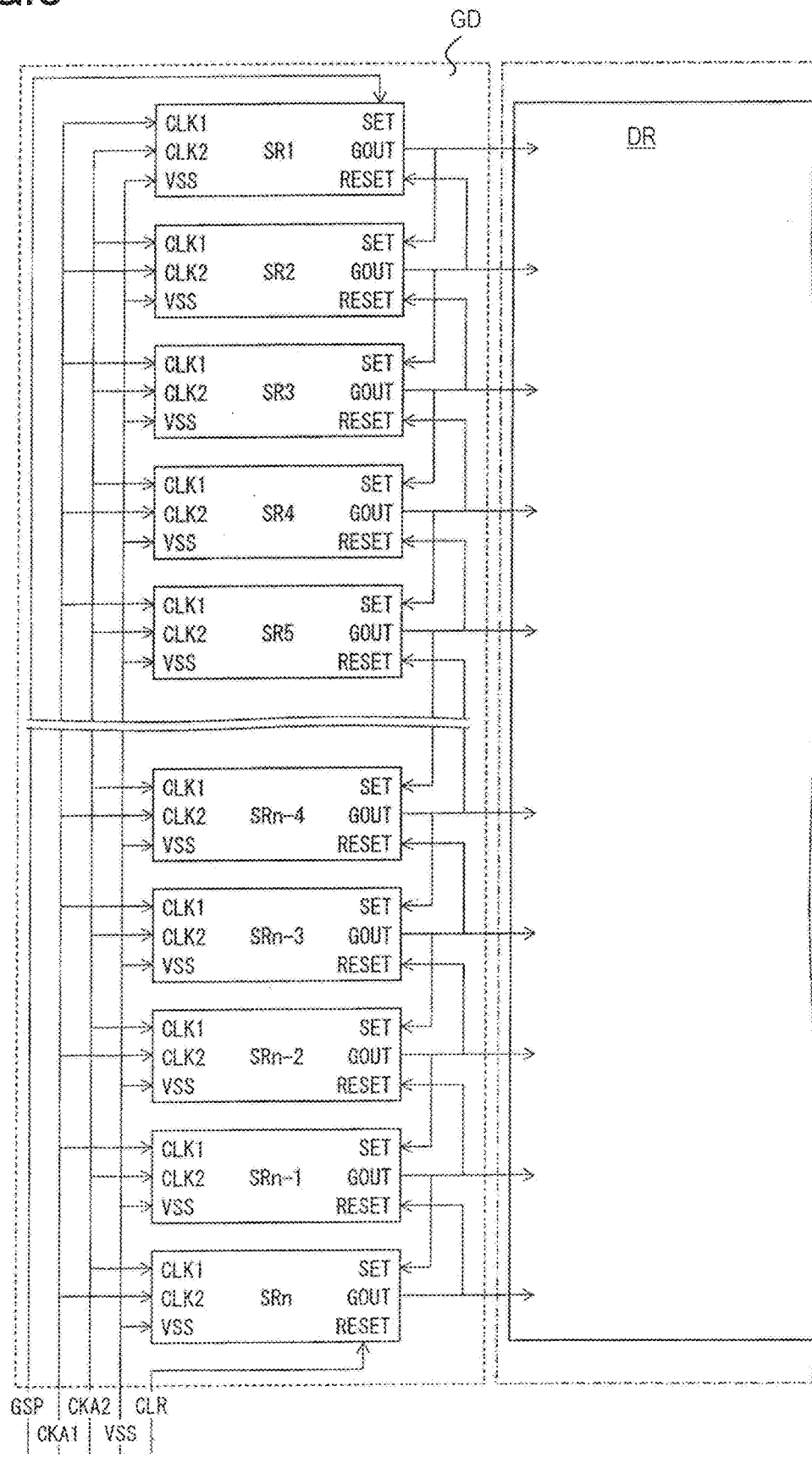
FIG. 8 is a diagram illustrating a shift register circuit constituting a gate driver GD.

FIG. 8 is a diagram illustrating a shift register circuit constituting a gate driver (monolithic gate driver) GD.

The shift register circuit has a plurality of unit circuits SR1 to SRn. The unit circuit SRk at each stage (k is a natural number of 1≤k≤n) is provided with a set terminal for inputting a set signal SET, an output terminal for outputting an output signal GOUT, a reset terminal for inputting a reset signal RESET, a Low power supply input terminal for inputting a Low power supply potential VSS, and a clock input terminal for inputting clock signals CLK1 and CLK2.

In the unit circuit SRk (k≥2), an output signal GOUTk−1 of a unit circuit SRk−1 at a previous stage is input to the set terminal. A gate start pulse signal GSP is input to the set terminal of the unit circuit SR1 at a first stage. In the unit circuit SRk (k≥1) at each stage, the output terminal outputs an output signal GOUTk to a corresponding scanning signal line disposed in the display region. An output signal GOUTk+1 of a unit circuit SRk+1 at a subsequent stage is input to the reset terminal of the unit circuit SRk (k≤n−1). A clear signal CLR is input to the reset terminal of the unit circuit SRn at a final stage.

Figure 9:
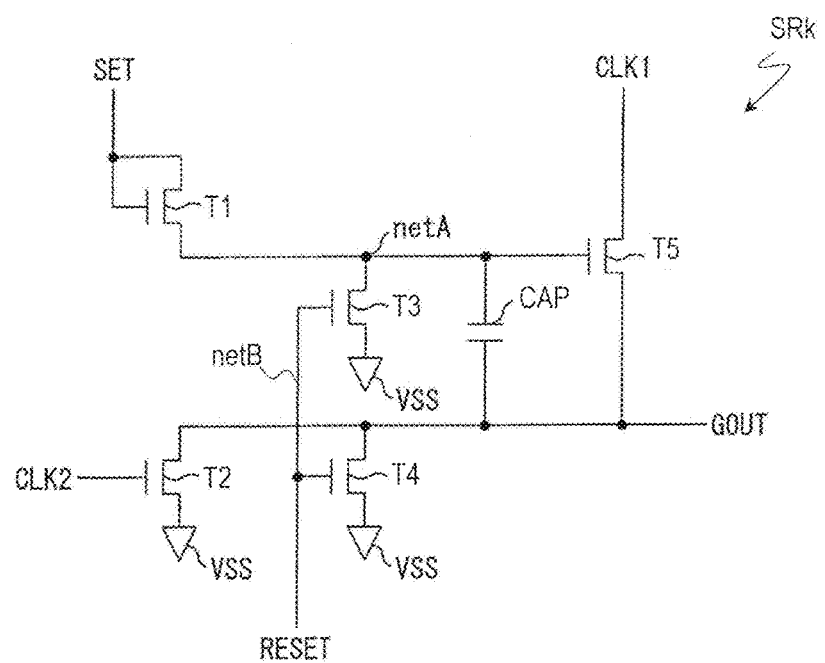
FIG. 9 is a diagram illustrating an example of a unit circuit SRk included in the shift register circuit.

FIG. 9 is a diagram illustrating an example of a unit circuit SRk.

For example, the unit circuit SRk is provided with five n-channel type thin film transistors T1 to T5 and a capacitor unit CAP.

T1 is an input transistor. The gate and drain of T1 are coupled to the set terminal, and the source of T1 is coupled to the gate of T5. T5 is an output transistor. The drain of T5 is coupled to the clock input terminal, and the source is coupled to the output terminal, respectively. That is, T5 acts as a transmission gate to pass or cut off the clock signal CLK1 input to the clock input terminal.

The capacitance unit CAP is coupled between the gate and the source of T5 as an output transistor. In the present specification, a node coupled to the gate of T5 is referred to as a "node net A", and a node coupled to the output terminal is referred to as a "node GOUT". One electrode of the capacitor unit CAP is coupled to the gate of T5 and the node net A, and the other electrode is coupled to the source of T5 and the node GOUT.

T3 is disposed between the Low power supply input terminal and the node net A. T3 is a pull-down transistor for lowering the potential of the node net A. The gate of T3 is coupled to the reset terminal, the drain is coupled to the node net A, and the source is coupled to the Low power supply input terminal, respectively. A node coupled to the gate of the pull-down transistor (T3 in this case) is referred to as a "node net B".

T2 and 14 are coupled to the node GOUT. The gate of T4 is coupled to the reset terminal, the drain is coupled to the output terminal, and the source is coupled to the Low power supply input terminal, respectively. The gate of T2 is coupled to the input terminal of the clock signal CLK2, the drain is coupled to the node GOUT, and the source is coupled to the Low power supply input terminal, respectively.

Circuit Layout

Figure 10A:
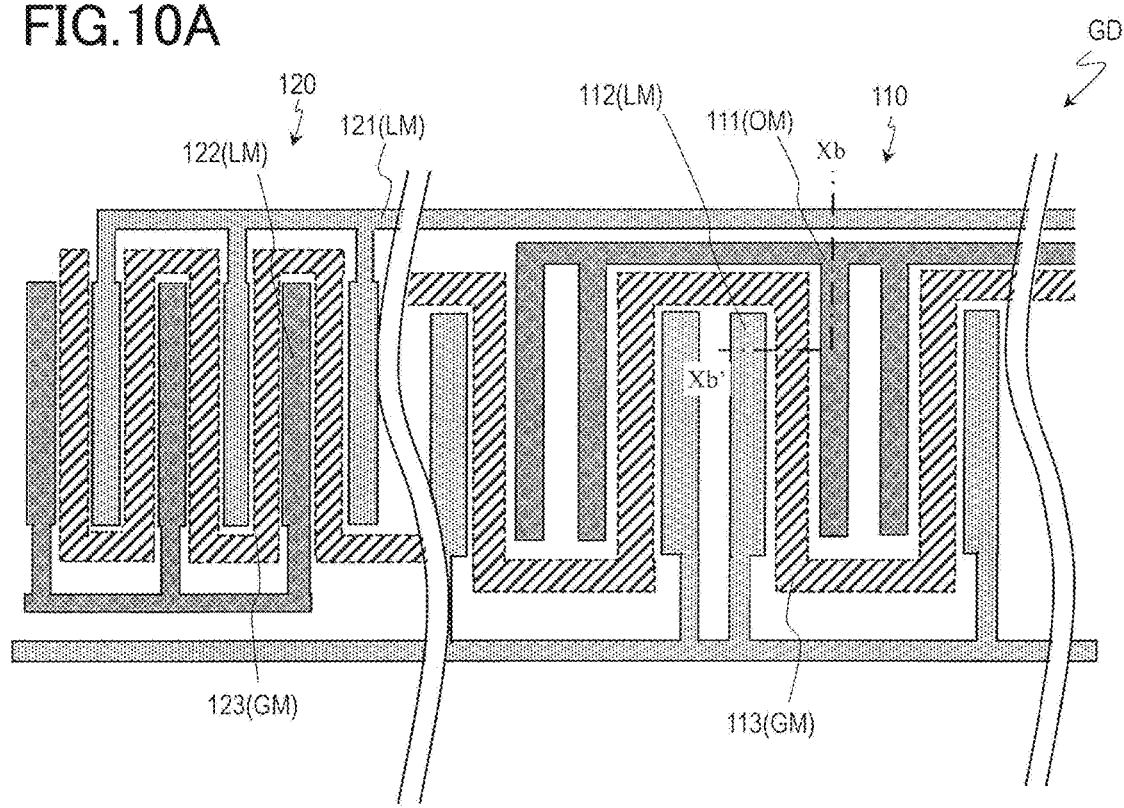
FIG. 10A is a plan view illustrating a portion of the unit circuit SRk in the gate driver GD.

FIG. 10A is a plan view illustrating a portion of the gate driver GD in the present embodiment, and illustrates two TFTs 110 and 120 in one unit circuit. A TFT 120 corresponds to, for example, the output transistor T5 in FIG. 9, and a TFT 121 corresponds to, for example, the transistor T3 in FIG. 9.

For example, the TFTs 110 and 120 are top-gate oxide semiconductor TFTs having an oxide semiconductor layer as an active layer. The TFTs 110 and 120 include an oxide semiconductor layer (not illustrated), gate electrode wires 113 and 123, first electrode wires 111 and 121, and second electrode wires 112 and 122, respectively. Here, the wiring including a portion functioning as the electrode of each TFT is referred to as "electrode wire". The "gate electrode wire" is wiring including the gate electrode, the "first electrode wire" is wiring including one electrode of the source electrode and the drain electrode of the TFT, and the "second electrode wire" is the other electrode of the source electrode and the drain electrode of the TFT.

The gate electrode wire 113 of the TFT 110 and the gate electrode wire 123 of the TFT 120 are formed, for example, in the gate metal layer GM. One of the first electrode wire 111 and the second electrode wire 112 in the TFT 110 is formed in the ohmic layer OM, and the other is formed in the lower metal layer LM. The same applies to the TFT 120, and the first electrode wire 121 and the second electrode wire 122 are formed in different layers. In this example, the first electrode wire 111 of the TFT 110 is formed in the ohmic layer OM, and the second electrode wire 112 is formed in the lower metal layer LM. The first electrode wire 121 of the TFT 120 is formed in the lower metal layer LM, and the second electrode wire 122 is formed in the ohmic layer OM.

Figure 10B:
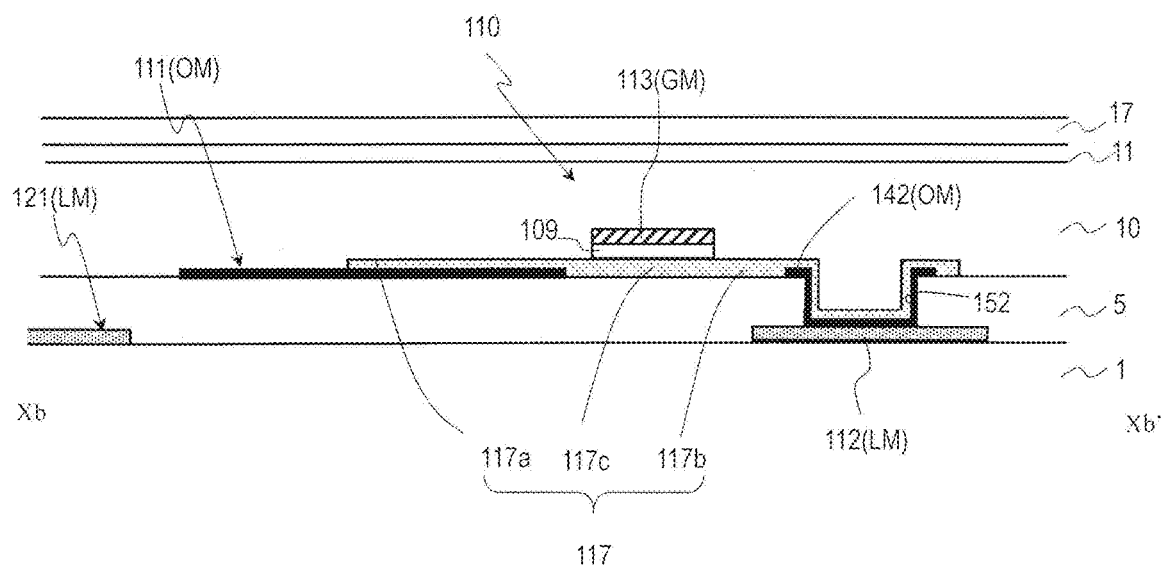
FIG. 10B is a sectional view of a TFT 110 taken along line Xb-Xb' illustrated in FIG. 10A.

FIG. 10B is a sectional view of the TFT 110 taken along the line Xb-Xb' illustrated in FIG. 10A.

The TFT 110 is provided with the second electrode wire 112 formed in the lower metal layer LM, the lower insulating layer 5 extending so as to cover the second electrode wire 112, the first electrode wire 111 formed in the ohmic layer OM and disposed on the lower insulating layer 5, the oxide semiconductor layer 117 disposed on the first electrode wire 111 and the lower insulating layer 5, and the gate electrode wire 113 disposed on the oxide semiconductor layer 117 with the gate insulating layer 109 therebetween.

The oxide semiconductor layer 117 includes a channel region 117c, and a first region 117a and a second region 117b disposed on both sides thereof, respectively. The first region 117a is disposed so as to be in direct contact with the first electrode wire 111, and as a result, is electrically coupled to the first electrode wire 111. The second region 117b of the oxide semiconductor layer 117 is electrically coupled to the second electrode wire 112 in the opening portion 152 formed in the lower insulating layer 5.

In the illustrated example, the oxide semiconductor layer 117 is coupled to the second electrode wire 112 with the ohmic conductive portion 142 formed in the opening portion 152 therebetween. The ohmic conductive portion 142 is an island-shaped portion formed in the ohmic layer OM, and is electrically insulated from the first electrode wire 111. The ohmic conductive portion 142 is in direct contact with the surface of the second electrode wire 112 exposed by the opening portion 152. The second region 117b of the oxide semiconductor layer 117 is in direct contact with the upper surface of the ohmic conductive portion 142. That is, it has the same configuration as the source contact portion described above with reference to FIG. 2B. In order to further reduce the circuit area, the oxide semiconductor layer 117 and the second electrode wire 112 may be disposed to be in direct contact with each other in the opening portion 152 without providing the ohmic conductive portion 142.

The TFT 110 is described here as an example, and the TFT 120 or another TFT that forms a circuit may have the same structure.

In the related art, both of the first electrode wire and the second electrode wire of each of the TFTs forming the gate driver circuit are formed in the same metal layer (for example, the same lower metal layer LM as the source bus line). Therefore, in order to reliably separate the first electrode wire and the second electrode wire, it is necessary to provide a sufficient space between these wires. Depending on the layout of the circuit, the electrode wires of the two TFTs may be disposed adjacent to each other and have portions extending in the same direction. In this case, these wires are disposed sufficiently apart from each other.

On the other hand, in the present embodiment, one of the first electrode wire 111 and the second electrode wire 112 of the TFT 110 is formed in the lower metal layer LM, and the other is formed in the ohmic layer OM. Since these electrode wires can be formed in different metal layers, the space between the first electrode wire 111 and the second electrode wire 112 in the TFT 110 can be reduced, and the area required for the TFT 110 can be reduced. The same applies to the TFT 120.

As illustrated in the drawing, the first electrode wires 111 and 121 of the TFT 110 and the TFT 120 are disposed adjacent to each other and have portions extending in the same direction. Therefore, one of these electrode wires (here, first electrode wire 111 of the TFT 110) may be formed in the ohmic layer OM, and the other may be formed in the lower metal layer LM. It is possible to reduce the distance between these wires, compared to the case where two wires are formed in the same metal layer. One wiring may be disposed so as to partially or wholly overlap the other wiring. As a result, it possible to further reduce the circuit area.

<About Oxide Semiconductor>

The oxide semiconductor included in the oxide semiconductor layer 7 may be an amorphous oxide semiconductor or a crystalline oxide semiconductor having a crystalline portion. Examples of the crystalline oxide semiconductor include a polycrystalline oxide semiconductor, a microcrystalline oxide semiconductor, and a crystalline oxide semiconductor in which a c-axis is substantially perpendicular to a layer surface.

The oxide semiconductor layer 7 may have a laminated structure of two or more layers. In the case where the oxide semiconductor layer 7 has a laminated structure, the oxide semiconductor layer 7 may include an amorphous oxide semiconductor layer and a crystalline oxide semiconductor layer. Alternatively, a plurality of crystalline oxide semiconductor layers having different crystal structures may be included. A plurality of amorphous oxide semiconductor layers may be included. In a case where the oxide semiconductor layer 7 has a two-layer structure including an upper layer and a lower layer, the energy gap of the oxide semiconductor included in a layer located on the gate electrode side (lower layer for bottom gate type, and upper layer for top gate type) of the two layers may be smaller than the energy gap of the oxide semiconductor included in a layer located on a side opposite to the gate electrode (upper layer for bottom gate type, and lower layer for top gate type). However, in a case where the difference in energy gap between these layers is relatively small, the energy gap of the oxide semiconductor in the layer located on the gate electrode side may be larger than the energy gap of the oxide semiconductor in the layer located on the side opposite to the gate electrode.

Materials, structures, film formation methods, structures of oxide semiconductor layers having a laminated structure, and the like of the amorphous oxide semiconductor and each of the above crystalline oxide semiconductors are described in, for example, Japanese Unexamined Patent Application Publication No. 2014-007399. For reference, the entire contents disclosed in Japanese Unexamined Patent Application Publication No. 2014-007399 are incorporated herein.

The oxide semiconductor layer 7 may include, for example, at least one metal element among In, Ga, and Zn. In the present embodiment, the oxide semiconductor layer 7 includes, for example, an In—Ga—Zn—O-based semiconductor (for example, indium gallium zinc oxide). Here, the In—Ga—Zn—O-based semiconductor is a ternary oxide of indium (In), gallium (Ga), and zinc (Zn), a ratio (composition ratio) of In, Ga, and Zn is not particularly limited, and includes, for example, In:Ga:Zn=2:2:1, In:Ga:Zn=1:1:1, In:Ga:Zn=1:1:2, and the like. Such an oxide semiconductor layer 7 can be formed of an oxide semiconductor film including an In—Ga—Zn—O-based semiconductor.

The In—Ga—Zn—O-based semiconductor may be amorphous or crystalline. As the crystalline In—Ga—Zn—O-based semiconductor, a crystalline In—Ga—Zn—O-based semiconductor in which the c-axis is oriented substantially perpendicular to the layer surface is preferable.

The crystal structure of a crystalline In—Ga—Zn—O-based semiconductor is disclosed in, for example, above Japanese Unexamined Patent Application Publication No. 2014-007399, Japanese Unexamined Patent Application Publication No. 2012-134475, and Japanese Unexamined Patent Application Publication No. 2014-209727. For reference, the entire contents disclosed in Japanese Unexamined Patent Application Publication No. 2012-134475 and Japanese Unexamined Patent Application Publication No. 2014-209727 are incorporated herein. A TFT having an In—Ga—Zn—O-based oxide semiconductor layer has high mobility (more than 20 times that of an a-Si TFT) and low leak current (less than 1/100 that of an a-Si TFT). Therefore, the TFT is suitably used as a driving TFT (for example, TFT included in a driving circuit provided on the same substrate as a display region around a display region including a plurality of pixels) and a pixel TFT (TFT provided in a pixel).

The oxide semiconductor layer 7 may include another oxide semiconductor instead of the In—Ga—Zn—O-based semiconductor. For example, an In—Sn—Zn—O-based semiconductor (for example, $In_2O_3$—$SnO_2$—ZnO; InSnZnO) may be included. The In—Sn—Zn—O-based semiconductor is a ternary oxide of indium (In), tin (Sn), and zinc (Zn). Alternatively, the oxide semiconductor layer 7 may include an In—Al—Zn—O-based semiconductor, an In—Al—Sn—Zn—O-based semiconductor, a Zn—O-based semiconductor, an In—Zn—O-based semiconductor, a Zn—Ti—O-based semiconductor, a Cd—Ge—O-based semiconductor, a Cd—Pb—O-based semiconductor, a cadmium oxide (CdO), Mg—Zn—O-based semiconductor, an In—Ga—Sn—O-based semiconductor, an In—Ga—O-based semiconductor, a Zr—In—Zn—O-based semiconductor, a Hf—In—Zn—O-based semiconductor, an Al—Ga—Zn—O-based semiconductor, a Ga—Zn—O-based semiconductor, an In—Ga—Zn—Sn—O-based semiconductor, and the like.

What is claimed is:

1. An active matrix substrate that includes a display region having a plurality of pixel regions, and a non-display region other than the display region, the active matrix substrate comprising:
   a substrate;
   a plurality of gate bus lines that is supported on a main surface of the substrate and extends in a first direction, and a plurality of source bus lines that extends in a second direction intersecting the first direction, and is located closer to the substrate than the plurality of gate bus lines;
   a lower insulating layer that is located between the plurality of source bus lines and the plurality of gate bus lines, and covers the plurality of source bus lines; and
   an oxide semiconductor TFT and a pixel electrode which are disposed in corresponding one of the plurality of pixel regions, wherein
   the oxide semiconductor TFT includes
   an oxide semiconductor layer disposed on the lower insulating layer, a gate electrode that is disposed on a portion of the oxide semiconductor layer with a gate insulating layer therebetween, and is electrically coupled to a corresponding one of the plurality of gate bus lines, a source electrode that is formed between the lower insulating layer and the substrate using a conductive film identical with a conductive film of the plurality of source bus lines, and is electrically coupled to a corresponding one of the plurality of source bus lines, and a first ohmic conductive portion that is formed of a conductive material capable of forming an ohmic contact with the oxide semiconductor layer and that is coupled to the oxide semiconductor layer and the source electrode, the oxide semiconductor layer includes a channel region, and a first region and a second region which are located on respective sides of the channel region, the first region is electrically coupled to the source electrode, and the second region is electrically coupled to the pixel electrode, the lower insulating layer includes a source opening portion exposing at least a portion of the source electrode, and the first ohmic conductive portion is disposed on the lower insulating layer and in the source opening portion and is in direct contact with at least the portion of the source electrode in the source opening portion, and the first region of the oxide semiconductor layer is in direct contact with an upper surface of the first ohmic conductive portion.

2. The active matrix substrate according to claim 1, wherein the oxide semiconductor TFT includes a second ohmic conductive portion that is disposed between the lower insulating layer and the second region of the oxide semiconductor layer, is formed of a conductive film identical with a conductive film of the first ohmic conductive portion, and is electrically insulated from the first ohmic conductive portion, and a drain electrode that couples the second region of the oxide semiconductor layer and the pixel electrode, the second region of the oxide semiconductor layer is in direct contact with an upper surface of the second ohmic conductive portion, and the drain electrode and the second ohmic conductive portion at least partially overlap each other with the oxide semiconductor layer therebetween.

3. The active matrix substrate according to claim 2, further comprising:

an interlayer insulating layer that covers the oxide semiconductor layer and the gate electrode, wherein the drain electrode is disposed on the interlayer insulating layer and in a drain opening portion formed in the interlayer insulating layer, and is in contact with an upper surface of the second region of the oxide semiconductor layer in the drain opening portion.

4. The active matrix substrate according to claim 1, wherein the oxide semiconductor TFT further includes a second ohmic conductive portion that is disposed between the lower insulating layer and the oxide semiconductor layer, is formed of a conductive film identical with a conductive film of the first ohmic conductive portion, and is electrically insulated from the first ohmic conductive portion, the second region of the oxide semiconductor layer is in direct contact with an upper surface of the second ohmic conductive portion, and the pixel electrode is in direct contact with the second region of the oxide semiconductor layer.

5. The active matrix substrate according to claim 4, wherein the second region of the oxide semiconductor layer includes an opening portion exposing a portion of the upper surface of the second ohmic conductive portion, and the pixel electrode is in direct contact with a side surface of the opening portion and the portion of the upper surface of the second ohmic conductive portion in the opening portion of the oxide semiconductor layer.

6. The active matrix substrate according to claim 1, wherein the first ohmic conductive portion is formed of a conductive film which is transparent, the pixel electrode is disposed between the lower insulating layer and the oxide semiconductor layer, and is formed of a conductive film identical with the conductive film of the first ohmic conductive portion, and the second region of the oxide semiconductor layer is in direct contact with an upper surface of the pixel electrode.

7. The active matrix substrate according to claim 1, wherein the oxide semiconductor layer covers an entirety of the upper surface and an entirety of a side surface of the first ohmic conductive portion.

8. The active matrix substrate according to claim 1, wherein neither the first ohmic conductive portion nor any conductive portion formed of a conductive film identical with a conductive film of the first ohmic conductive portion is disposed at an intersection portion in which the corresponding one of the source bus lines and the corresponding one of the gate bus lines intersect each other, when viewed from a direction normal to the substrate.

9. The active matrix substrate according to claim 1, further comprising:

an ohmic wiring unit that is formed of a conductive film identical with a conductive film of the first ohmic conductive portion, and extends in the first direction along the corresponding one of the source bus lines, wherein the ohmic wiring unit extends so as to couple first ohmic conductive portions of two adjacent oxide semiconductor TFTs coupled to the corresponding one of the source bus lines.

10. The active matrix substrate according to claim 9, wherein the ohmic wiring unit is disposed on the corresponding one of the source bus lines with the lower insulating layer therebetween.

11. The active matrix substrate according to claim 9, further comprising:

a wiring protection portion that is formed of a semiconductor film identical with a conductive film of the oxide semiconductor layer, and extends in the first direction so as to cover the ohmic wiring unit.

12. The active matrix substrate according claim 1, further comprising:
   at least one another oxide semiconductor TFT disposed in the non-display region, wherein
   the at least one other oxide semiconductor TFT includes another oxide semiconductor layer, a source electrode wire coupled to a portion of the other oxide semiconductor layer, a drain electrode wire coupled to another portion of the other oxide semiconductor layer, and a gate electrode wire disposed on the other oxide semiconductor layer with an insulating layer therebetween, and
   one of the source electrode wire and the drain electrode wire is formed between the lower insulating layer and the substrate using a conductive film identical with the conductive film of the plurality of source bus lines, and another of the source electrode wire and the drain electrode wire is formed on the lower insulating layer using a conductive film identical with a conductive film of the first ohmic conductive portion.

13. The active matrix substrate according to claim 1, wherein
   the first ohmic conductive portion mainly contains at least one metal selected from the group consisting of Ti, Mo, Ta, and W.

14. The active matrix substrate according to claim 13, wherein
   the first ohmic conductive portion is formed of a Ti film or a Mo film.

15. The active matrix substrate according to claim 1, wherein
   the first ohmic conductive portion mainly contains at least one metal oxide selected from the group consisting of indium tin oxide, indium zinc oxide, zinc oxide, and tin oxide.

16. The active matrix substrate according to claim 1, wherein
   the plurality of source bus lines include a low resistance metal layer containing Cu or Al, and the first ohmic conductive portion is in direct contact with the low resistance metal layer.

17. The active matrix substrate according to claim 1, wherein
   the oxide semiconductor layer includes an In—Ga—Zn—O-based semiconductor.

18. The active matrix substrate according to claim 17, wherein
   the In—Ga—Zn—O-based semiconductor includes a crystalline portion.

* * * * *